(12) United States Patent
Li et al.

(10) Patent No.: US 12,199,643 B1
(45) Date of Patent: Jan. 14, 2025

(54) CONTROLLABLE LOSSY COMPRESSION SYSTEM USING JOINT LEARNING

(71) Applicant: AtomBeam Technologies Inc., Moraga, CA (US)

(72) Inventors: Zhu Li, Overland Park, KS (US); Paras Maharjan, Kansas City, MO (US); Brian Galvin, Silverdale, WA (US)

(73) Assignee: ATOMBEAM TECHNOLOGIES INC, Moraga, CA (US)

( * ) Notice: Subject to any disclaimer, the term of this patent is extended or adjusted under 35 U.S.C. 154(b) by 0 days.

(21) Appl. No.: 18/791,425

(22) Filed: Aug. 1, 2024

Related U.S. Application Data

(63) Continuation-in-part of application No. 18/623,018, filed on Mar. 31, 2024, now Pat. No. 12,119,848.

(51) Int. Cl.
*H03M 7/00* (2006.01)
*H03M 7/30* (2006.01)

(52) U.S. Cl.
CPC ....... *H03M 7/3059* (2013.01); *H03M 7/3082* (2013.01); *H03M 7/6005* (2013.01); *H03M 7/6011* (2013.01)

(58) Field of Classification Search
CPC ............. H03M 7/3059; H03M 7/3082; H03M 7/6005; H03M 7/6011
USPC ...................................... 341/50, 51
See application file for complete search history.

(56) References Cited

U.S. PATENT DOCUMENTS 10,827,039 B1    11/2020   Dandekar et al.
11,375,194 B2 *  6/2022    Liu ...................... H04N 19/463

* cited by examiner

*Primary Examiner* — Jean B Jeanglaude
(74) *Attorney, Agent, or Firm* — Galvin Patent Law LLC; Brian R. Galvin

(57) ABSTRACT

A system and method for controllable lossy data compression employing a joint learning framework to efficiently compress and reconstruct input data while balancing compression ratio and reconstruction quality. The system comprises an encoding system, a temporal modeling system, and a decoding system, which are jointly optimized to minimize a combined loss function. The encoding system, such as a Vector Quantized Variational Autoencoder (VQ-VAE) compresses the input data into a compact representation, while introducing a controllable degree of lossy compression based on adjustable compression parameters. The temporal modeling system, such as a Multilayer Perceptron Long Short-Term Memory captures temporal dependencies in the compressed representation. The decoding system, such as a VQ-VAE decoder, reconstructs the input data from the compressed representation. By providing control over the trade-off between compression ratio and reconstruction quality, the system offers flexibility for diverse applications.

30 Claims, 20 Drawing Sheets

CONTROLLABLE LOSSY COMPRESSION SYSTEM USING JOINT LEARNING

CROSS-REFERENCE TO RELATED APPLICATIONS

Priority is claimed in the application data sheet to the following patents or patent applications, each of which is expressly incorporated herein by reference in its entirety:
Ser. No. 18/623,018

BACKGROUND OF THE INVENTION

Field of the Art

The present invention relates to the field of data compression and, more particularly, to a controllable lossy compression system using a Vector Quantized Variational Autoencoder (VQ-VAE) and a Multilayer Perceptron Long Short-Term Memory (MLP-LSTM) joint learning system.

Discussion of the State of the Art

Data compression plays an important role in efficiently storing and transmitting large amounts of data. Lossy compression techniques allow for higher compression ratios by sacrificing some information during the compression process. However, controlling the degree of information loss while maintaining acceptable reconstruction quality remains a challenge.

Existing lossy compression methods often lack flexibility in balancing compression efficiency and reconstruction quality. They may not effectively capture the temporal dependencies and patterns in the data, leading to suboptimal compression performance.

One area where data compression has become exceedingly important is related to telemetry, tracking, and command (TT&C) subsystems which are used in satellite systems. TT&C subsystems play a crucial role in facilitating essential communications between satellites and ground stations. In many cases, TT&C subsystems are the sole means through which satellites' operations and status can be monitored and controlled remotely from earth. Many satellite systems demand transmitting massive quantities of information over large distances; a process which becomes exponentially easier when the information is compressed.

What is needed is a system and method for controllable lossy compression that can adapt to different data domains, balance compression efficiency and reconstruction quality, and effectively model the temporal dynamics of the data.

SUMMARY OF THE INVENTION

Accordingly, the inventor has conceived and reduced to practice, a system and method for controllable lossy data compression employing a joint learning framework to efficiently compress and reconstruct input data while balancing compression ratio and reconstruction quality. The system comprises an encoding system, a temporal modeling system, and a decoding system, which are jointly optimized to minimize a combined loss function. The encoding system, such as a Vector Quantized Variational Autoencoder (VQ-VAE) compresses the input data into a compact representation, while introducing a controllable degree of lossy compression based on adjustable compression parameters. The temporal modeling system, such as a Multilayer Perceptron Long Short-Term Memory captures temporal dependencies in the compressed representation. The decoding system, such as a VQ-VAE decoder, reconstructs the input data from the compressed representation. By providing control over the trade-off between compression ratio and reconstruction quality, the system offers flexibility for diverse applications.

According to a preferred embodiment, a system for controllable lossy compression is disclosed, comprising: a computing device comprising at least a memory and a processor; a plurality of programming instructions stored in the memory and operable on the processor, wherein the first plurality of programming instructions, when operating on the processor, cause the computing device to: encode input data into a compressed representation using an encoding system; introduce a controllable degree of lossy compression to the compressed representation based on one or more compression parameters; model temporal dependencies in the compressed representation using a temporal modeling system; reconstruct the input data from the compressed representation using a decoding system; and jointly optimize the encoding system, the temporal modeling system, and the decoding system to minimize a joint loss function.

According to another preferred embodiment, a method for controllable lossy compression is disclosed, comprising the steps of: encoding input data into a compressed representation using an encoding system; introducing a controllable degree of lossy compression to the compressed representation based on one or more compression parameters; modeling temporal dependencies in the compressed representation using a temporal modeling system; reconstructing the input data from the compressed representation using a decoding system; and jointly optimizing the encoding system, the temporal modeling system, and the decoding system to minimize a joint loss function.

According to another preferred embodiment, non-transitory, computer-readable storage media having computer-executable instructions embodied thereon that, when executed by one or more processors of a computing system employing a controllable lossy compression system, cause the computing system to: encode input data into a compressed representation using an encoding system; introduce a controllable degree of lossy compression to the compressed representation based on one or more compression parameters; model temporal dependencies in the compressed representation using a temporal modeling system; reconstruct the input data from the compressed representation using a decoding system; and jointly optimize the encoding system, the temporal modeling system, and the decoding system to minimize a joint loss function.

According to an aspect of an embodiment, the encoding system comprises a Vector Quantized Variational Autoencoder (VQ-VAE) encoder.

According to an aspect of an embodiment, the one or more compression parameters include a size of a learned codebook used by the VQ-VAE encoder for quantization.

According to an aspect of an embodiment, the temporal modeling system comprises a Multilayer Perceptron Long Short-Term Memory system.

According to an aspect of an embodiment, the decoding system comprises a Vector Quantized Variational Autoencoder decoder.

According to an aspect of an embodiment, the joint loss function comprises a combination of reconstruction loss, quantization loss, and temporal modeling loss.

According to an aspect of an embodiment, the input data comprises one or more of image data, video data, audio data, and time-series data.

According to an aspect of an embodiment, the computing device is further caused to preprocess the input data using a data preprocessing system prior to encoding the input data.

According to an aspect of an embodiment, the computing device is further caused to post-process the reconstructed input data using a data post-processing system.

According to an aspect of an embodiment, the one or more compression parameters are adjustable based on a desired trade-off between compression ratio and reconstruction quality.

BRIEF DESCRIPTION OF THE DRAWING FIGURES

DETAILED DESCRIPTION OF THE INVENTION

Figure 1A:
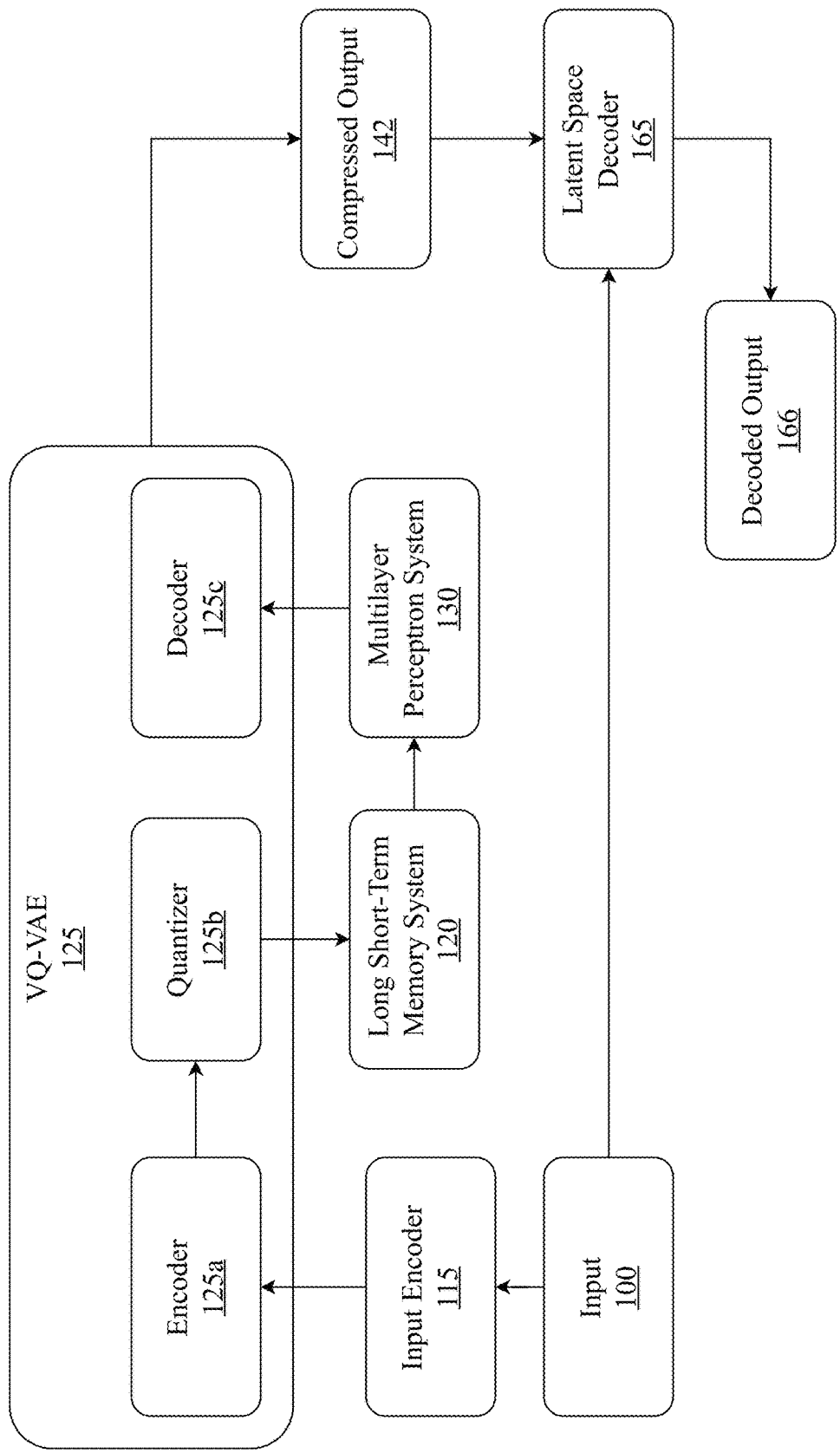
FIG. 1A is a block diagram illustrating an exemplary system architecture for controllable lossy compression using an MLP-LSTM framework, according to an embodiment.

The inventor has conceived, and reduced to practice, a system and method for controllable lossy data compression employing a joint learning framework to efficiently compress and reconstruct input data while balancing compression ratio and reconstruction quality. The system comprises an encoding system, a temporal modeling system, and a decoding system, which are jointly optimized to minimize a combined loss function. The encoding system, such as a Vector Quantized Variational Autoencoder (VQ-VAE) compresses the input data into a compact representation, while introducing a controllable degree of lossy compression based on adjustable compression parameters. The temporal modeling system, such as a Multilayer Perceptron Long Short-Term Memory captures temporal dependencies in the compressed representation. The decoding system, such as a VQ-VAE decoder, reconstructs the input data from the compressed representation. By providing control over the trade-off between compression ratio and reconstruction quality, the system offers flexibility for diverse applications.

The system and methods described herein address the aforementioned needs by providing a controllable lossy compression system using a VQ-VAE MLP-LSTM joint learning system. The system combines the benefits of vector quantization, variational autoencoders, and temporal modeling to achieve efficient and adaptable lossy compression.

In one embodiment, the controllable lossy compression system comprises an input encoding system, a VQ-VAE encoder, a vector quantization layer, an MLP-LSTM system, a VQ-VAE decoder, and an output decoding system. The input encoding system extracts features from the input data, and the VQ-VAE encoder further compresses the features into a compact representation. The vector quantization layer discretizes the compressed representation using a learned codebook, introducing controllable lossy compression. The MLP-LSTM system captures the temporal dependencies and patterns in the quantized representation. The VQ-VAE decoder reconstructs the original features from the MLP-LSTM output, and the output decoding system generates the final reconstructed data.

The degree of lossy compression can be controlled by adjusting the size of the codebook in the vector quantization layer. A smaller codebook results in higher compression ratios but more information loss, while a larger codebook preserves more information but reduces compression efficiency. The codebook size can be treated as a tunable hyperparameter to achieve the desired trade-off between compression and reconstruction quality.

The system utilizes joint learning, where the VQ-VAE and MLP-LSTM components are trained together end-to-end.

Joint learning allows the VQ-VAE to generate quantized representations that are well-suited for the MLP-LSTM, while the MLP-LSTM learns to effectively model the temporal dynamics of the quantized data. The joint learning process is guided by a combination of reconstruction loss, quantization loss, and temporal modeling loss, which are minimized during training.

The controllable lossy compression system can be applied to various data domains, including but not limited to images, audio, video, and time series data. It provides flexibility in balancing compression efficiency and reconstruction quality based on the specific requirements of the application.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods, and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Conceptual Architecture

FIG. 1A is a block diagram illustrating an exemplary system architecture for controllable lossy compression using an MLP-LSTM framework, according to an embodiment. In one embodiment, the system and method may comprise an input 100, an input encoding system 115, vector quantized variational autoencoder (VQ-VAE) 125, a long short-term memory system (LSTM) 120, a multilayer perceptron system 130, an output encoder 135, a SoftMax function 140, a first compressed output 141, an arithmetic encoder 150, and a second compressed output 160. In one embodiment, the input encoding system 115 receives the input 100 or plurality of inputs 100 from a source. The input 100 may include, but is not limited to a text file, a video file, an audio file, or any other file which includes a plurality of information.

According to the embodiment, the input encoder system 115, which can be a convolutional neural network (CNN) or a fully connected network), depending on the nature of the input data (CNN for image data, fully connected network for other data types), prepares an input 100 for further processing by a plurality of neural network and/or deep learning systems. The input encoder system 115 learns to extract meaningful features from the raw input and maps it to a lower-dimensional latent space. The input encoding system learns to capture the relevant information from the input data and provides a compact representation suitable for further processing.

The latent representation from the input encoder system 115 is then passed through a VQ-VAE 125 module. The VQ-VAE 125 comprises an encoder 125a, a vector quantization layer 125b, and a decoder 125c. The VAE encoder 125*a* further compresses the latent representation into a compact form. The VQ-VAE encoder 125*a* learns to generate a compressed representation that captures the essential information from the latent representation while reducing its dimensionality. The vector quantization layer 125*b* discretizes the compressed representation into a finite set of vectors from a learned codebook. The codebook is a collection of representative vectors, and each latent vector is assigned to the nearest codebook vector. The VAE decoder 125*c* reconstructs the original latent representation from the quantized vectors.

The degree of lossy compression can be controlled by adjusting the size of the codebook in the vector quantization layer 125*b*. For example, a smaller codebook results in higher compression ratios but also introduces more quantization error and loss of information. Conversely, a larger codebook allows for better reconstruction quality but reduces the compression ratio. The size of the codebook can be treated as a tunable parameter to achieve the desired trade-off between compression and quality.

The quantized vectors from the VQ-VAE 125 may then be fed into the MLP-LSTM framework as described herein. The MLP-LSTM learns to model the temporal dependencies and patterns in the quantized representations. The output of the MLP-LSTM system represents a processed version of the quantized vectors that captures the sequential patterns and dynamics.

In one embodiment, the long short-term memory system 120 is a plurality of recurring neural network architectures which further processes the quantized vectors for compression. The LSTM 120 is a special kind of recurring neural network where the present output depends on the LSTM's understanding of the previous output. The LSTM 120 is capable of learning long term dependency through the use of a plurality of gates that allows the LSTM 120 to add and remove information to a cell state. After a quantized vector output is processed by the LSTM 120, it may be processed by the multilayer perceptron system 130. According to an embodiment, the multilayer perceptron system (MLP) 130 is a neural network which uses a PAQ algorithm to achieve data compression. A PAQ algorithm refers to a plurality of lossless data compression algorithms which are exceptionally effective and have high compression ratios for many different data types. In one embodiment, the MLP 130 may be a shallow MLP where a plurality of inputs are operated on by a plurality of weights which creates a large linear plurality of hidden nodes which are grouped into sets. The plurality of hidden nodes may be operated on a small plurality of additional weights which converges the hidden nodes into a single output node. A key feature of a shallow MLP 130 is that the plurality of hidden nodes are operated on by the additional weights in one step, rather than a plurality of steps.

In one embodiment, the quantized vector output which has been processed by the LSTM 120 is transformed by the MLP 130 which may be a shallow MLP 130 into a neural network output. The VQ-VAE decoder 125*c* takes the MLP-LSTM output and reconstructs an approximation of the original latent representation. This reconstructed latent representation is a lossy version of the latent representation obtained from the input encoding system. The VQ-VAE 125 produces the lossy compressed output 142 as a compressed version of the input 100.

As shown, according to an embodiment, a latent space decoder 165 may be present. The output 142 from the VQ-VAE can passed through latent space decoder network 165. Latent space decoder 165 generates a reconstructed version of the raw input data based on the reconstructed latent representation. This reconstructed raw input data is an approximation of the original input data, taking into account the information loss during the compression and reconstruction process. If the input data is an image, the latent space decoder can be a convolutional decoder network that upsamples the reconstructed latent representation and generates a reconstructed image. If the input data is a time series or sequence, the latent space decoder can be a recurrent neural network (RNN) or a transformer-based model that generates a reconstructed sequence based on the reconstructed latent representation.

In this way, the system can be used for controllable lossy compression of a plurality of input data resulting in a compressed data representation. The compressed data 142 may be stored or transmitted to another application, service, device, and/or the like. The decoder network 165 allows for the recovery of the original input data from the compressed representation after it has been obtained from storage or transmission. By including a latent space decoder, the overall system can be used for tasks such as data compression, denoising, or data generation. The reconstructed raw input data obtained from the latent space decoder provides a readable or interpretable version of the compressed data.

According to an embodiment, the system described in FIG. 1A may be configured for joint learning of the end-to-end system, where the input encoder, VQ-VAE, MLP-LSTM, and latent space decoder are trained together. Joint learning allows the VQ-VAE and MLP-LSTM to be optimized together, enabling them to adapt to each other's characteristics. The VQ-VAE can learn to generate quantized representations that are well-suited for the MLP-LSTM, while the MLP-LSTM can learn to effectively model the temporal dependencies in the quantized data. The training objective for the latent space decoder is to minimize the difference between the reconstructed raw input data and the original input data. By training the entire system end-to-end, an objective function can be designed to minimize the reconstruction error between the original input and the reconstructed output. This ensures that the lossy compression introduced by the VQ-VAE is optimized in conjunction with the temporal modeling capabilities of the MLP-LSTM. Furthermore, joint learning allows the system to adapt to the specific characteristics of the input data domain. The encoding and decoding networks can learn domain-specific features, while the VQ-VAE and MLP-LSTM can capture the inherent structure and temporal dynamics of the data. Joint learning introduces additional hyperparameters that need to be tuned, such as the size of the VQ-VAE codebook, the dimensionality of the latent space, and the architecture of the encoding and decoding networks.

In the joint learning system, the degree of lossy compression can be controlled through the vector quantization process in the VQ-VAE component. Vector quantization introduces a trade-off between compression efficiency and reconstruction quality, and this trade-off can be adjusted by modifying certain hyperparameters and design choices.

The codebook size, denoted as K, is a key hyperparameter in controlling the degree of lossy compression. The codebook is a collection of learned vector representations, and each latent vector from the VQ-VAE encoder is assigned to the nearest codebook vector during the quantization process. A smaller codebook size (smaller K) results in higher compression ratios but also introduces more quantization error and loss of information. With fewer codebook vectors, each vector represents a larger portion of the latent space, leading to a coarser quantization and potentially losing fine-grained details. Conversely, a larger codebook size (larger K) allows for more precise quantization and better reconstruction quality but reduces the compression ratio. With more codebook vectors, each vector represents a smaller portion of the latent space, enabling the preservation of more detailed information. The choice of the codebook size depends on the desired balance between compression efficiency and reconstruction quality. It can be treated as a tunable hyperparameter during the training process.

The codebook vectors are learned during the training process using a combination of reconstruction loss and codebook loss. The reconstruction loss encourages the VQ-VAE to generate codebook vectors that can effectively reconstruct the original latent representations, while the codebook loss helps in learning a diverse and representative set of codebook vectors. The codebook learning process aims to find a set of codebook vectors that minimize the quantization error while maximizing the reconstruction quality. The codebook vectors are updated iteratively during training based on the gradients of the reconstruction loss and codebook loss. The learning process can be influenced by the choice of loss functions, such as, for example, mean squared error for reconstruction loss and vector quantization loss (VQ loss) for codebook learning. These loss functions can be weighted differently to prioritize either compression efficiency or reconstruction quality.

Quantization regularization techniques can be applied to control the degree of lossy compression and encourage the learning of a more compact and efficient codebook. One common technique is codebook regularization, which adds a regularization term to the training objective to penalize the codebook vectors that are rarely used or have low assignment frequencies. This encourages the model to learn a more compact and informative codebook, reducing redundancy and improving compression efficiency. Another approach is to use commitment loss, which encourages the VQ-VAE encoder to generate latent vectors that are close to the assigned codebook vectors. This helps in reducing the quantization error and improving the stability of the quantization process.

The dimensionality of the latent space, i.e., the size of the latent vectors, also plays a role in controlling the degree of lossy compression. A lower-dimensional latent space generally results in higher compression ratios but may limit the expressiveness and reconstruction quality. Reducing the dimensionality of the latent space forces the VQ-VAE to learn a more compact representation, potentially sacrificing some fine-grained details. However, it can lead to improved compression efficiency. Increasing the dimensionality of the latent space allows for more expressive representations and better reconstruction quality but may reduce the compression ratio. The choice of latent space dimensionality depends on the complexity of the input data and the desired balance between compression and reconstruction quality.

By adjusting these hyperparameters and design choices, such as the codebook size, codebook learning process, quantization regularization techniques, and latent space dimensionality, the degree of lossy compression can be controlled in the vector quantization process of the VQ-VAE. The joint learning system allows for this flexibility in controlling the lossy compression through the vector quantization process, enabling the adaptation to different data domains and compression needs.

In some implementations, a data post-processing system may be present and configured to apply one or more data processing techniques to the reconstructed data outputs. Data post-processing techniques that may be implemented can include, but are not limited to, denoising such as applying denoising algorithms to the reconstructed data to remove any artifacts or noise introduced during the compression and reconstruction process, super-resolution such as enhancing the resolution or quality of the reconstructed data using techniques like interpolation or generative models to improve perceptual quality, color correction such as adjusting the color balance or contrast of the reconstructed data to match the original input data more closely, artifact removal such as removing compression artifacts, such as blocking or ringing effects, from the reconstructed data using specialized filters or algorithms, perceptual enhancement such as applying perceptual models or algorithms to improve the subjective quality of the reconstructed data, such as sharpening edges or enhancing texture details, domain-specific post-processing such as performing post-processing techniques specific to the data domain, such as speech enhancement for audio data or object detection for image data, and error correction such as applying error correction codes or algorithms to the reconstructed data to mitigate any errors or losses introduced during the compression and reconstruction process.

According to some aspects, the input encoder and VQ-VAE system together represent an encoder system, the MLP-LSTM system represents a temporal dependency system, and the VQ-VAE decoder and latent space decoder represents a decoder system.

According to an aspect, the VQ-VAE may comprise a plurality of encoder layers and decoders layers which can be used for performing multi-stage compression on multiple input stages.

Figure 1B:
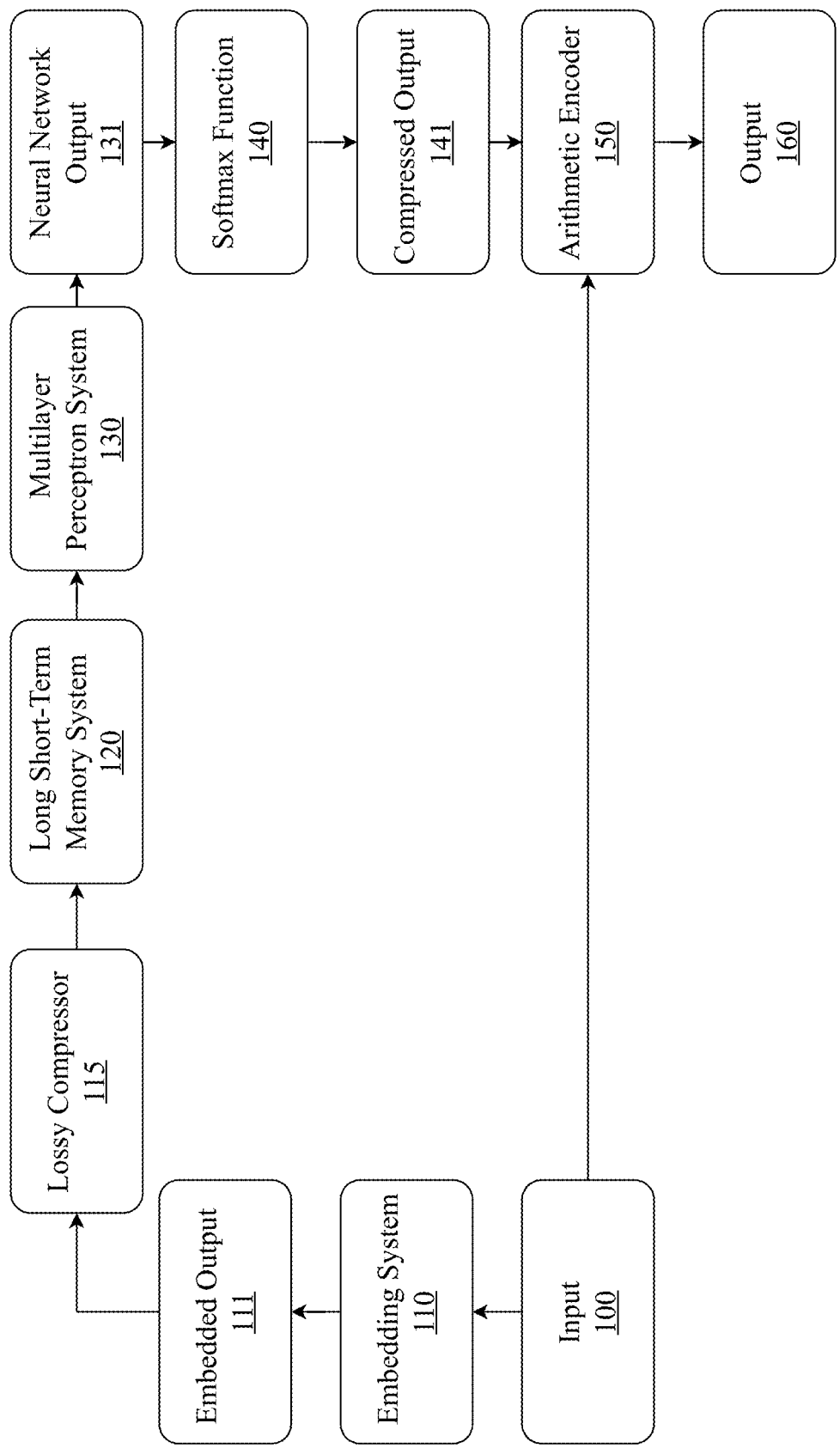
FIG. 1B is a block diagram illustrating an exemplary system architecture for learning-based, controllable lossy data compression.

FIG. 1B is a block diagram illustrating an exemplary system architecture for learning-based, controllable lossy data compression. In one embodiment, the system and method may comprise an input 100, an embedding system 110, an embedded output 111, a lossy compressor 115, a long short-term memory system (LSTM) 120, a multilayer perceptron system 130, a neural network output 131, a SoftMax function 140, a first compressed output 141, an arithmetic encoder 150, and a second compressed output 160. In one embodiment, the embedding system 110 receives the input 100 or plurality of inputs 100 from a source. The input 100 may include, but is not limited to a text file, a video file, an audio file, or any other file which includes a plurality of information. The embedding system 110 prepares an input 100 for further processing by a plurality of neural network systems. The embedding system 110 turns the input 100 into an embedded output 111 which may then be processed by a quantizer 115.

According to some embodiments, the lossy compressor component may be implemented as a quantizer. One common approach to achieve lossy compression is through quantization. In this case, the embedded output or the learning-based output (referring to FIG. 1C) can be quantized to reduce the precision of the values. This can be done by dividing the range of values into a fixed number of intervals and representing each value by the index of the interval it falls into. The quantization step size determines the level of compression and the amount of information loss. Larger quantization step sizes result in higher compression ratios but also introduce more distortion.

According to some embodiments, adaptive quantization may be performed by one or more of the quantization modules described herein. Instead of using a fixed quantization step size, adaptive quantization can be employed to allocate more bits to regions or features that are perceptually important or have higher variability. This can be achieved by learning a quantization codebook or a quantization function that adapts to the characteristics of the input data. Adaptive quantization allows for more efficient compression by allocating bits where they are needed the most.

In another embodiment, a technique for lossy compression that may be implemented is thresholding. This involves setting a threshold value and discarding or truncating any values below the threshold. In the context of the learning-based compression system, thresholding can be applied to the embedded output 111, the learning-based output 131, or the compressed output 141. By discarding or truncating small values, the compression ratio can be improved at the cost of some information loss.

In yet another embodiment, the lossy compressor 115 may be implemented as a lossy autoencoder. The existing architecture can be extended to include a lossy autoencoder component. An autoencoder is a neural network that consists of an encoder and a decoder. The encoder compresses the input data into a lower-dimensional representation, while the decoder reconstructs the original data from the compressed representation. By introducing a bottleneck layer with a limited number of neurons, the autoencoder can learn to compress the data in a lossy manner. The degree of compression and information loss can be controlled by adjusting the size of the bottleneck layer.

In some domains, such as image or audio compression, perceptual loss can be used to guide the lossy compression process. Perceptual loss measures the difference between the original and reconstructed data based on perceptual similarity rather than exact numerical values. This allows for more aggressive compression while maintaining perceptual quality. Perceptual loss functions, such as structural similarity index (SSIM) for images or perceptual evaluation of speech quality (PESQ) for audio, can be incorporated into the training objective of the learning-based compression system.

To control the trade-off between compression ratio and reconstruction quality, rate-distortion optimization can be employed. This involves defining an objective function that balances the compression rate (bits per sample) and the distortion (reconstruction error). The objective function can be minimized during training to find the optimal compression parameters that achieve the desired rate-distortion trade-off. Techniques such as Lagrange multiplier methods or reinforcement learning can be used to solve the rate-distortion optimization problem.

In some implementations, after the lossy compression stage, post-processing techniques can be applied to enhance the reconstructed data and reduce artifacts. This can include denoising, super-resolution, or domain-specific restoration methods. Post-processing can help improve the perceptual quality of the reconstructed data and mitigate the effects of information loss introduced by lossy compression.

The output of the lossy compressor 115 may be sent for further processing to LSTM 120. In one embodiment, the long short-term memory system 120 is a plurality of recurring neural network architectures which further processes the embedded output 111 for compression. The LSTM 120 is a special kind of recurring neural network where the present output depends on the LSTM's understanding of the previous output. The LSTM 120 is capable of learning long term dependency through the use of a plurality of gates that allows the LSTM 120 to add and remove information to a cell state. After a lossy output is processed by the LSTM 120, the lossy output is processed by the multilayer perceptron system 130. The multilayer perceptron system (MLP) 130 is a neural network which uses a PAQ algorithm to achieve data compression. A PAQ algorithm refers to a plurality of lossless data compression algorithms which are exceptionally effective and have high compression ratios for many different data types. In one embodiment, the MLP 130 may be a shallow MLP where a plurality of inputs are operated on by a plurality of weights which creates a large linear plurality of hidden nodes which are grouped into sets. The plurality of hidden nodes may be operated on a small plurality of additional weights which converges the hidden nodes into a single output node. A key feature of a shallow MLP 130 is that the plurality of hidden nodes are operated on by the additional weights in one step, rather than a plurality of steps. In one embodiment, the lossy output which has been processed by the LSTM 120 is transformed by the MLP 130 which may be a shallow MLP 130 into a neural network output 131. The neural network output 131 may then be operated on by a SoftMax function 140 which generates a compressed output 141. The compressed output 141 is a compressed version of the input 100 where some information has been lost during the compression process.

In another embodiment, the first compressed output 141 may then be passed to an arithmetic encoder 150 which may also receive the input 100. The arithmetic encoder 150 may generate a probability output by analyzing and processing the input 100 and the first compressed output 141. The arithmetic encoder 150 may also receive the input 100 and the first compressed output 141 where it generates a second compressed output 160. Generally, an arithmetic encoder receives a string with a length which is compressed to the shortest byte string which represents a number (X) within a particular range. In some embodiments, the arithmetic encoder 150 may be an arithmetic encoder in PAQ. An arithmetic encoder in PAQ maintains for each prediction an upper and lower limit on X. Concluding each prediction, the current range of X is split into parts representing the probabilities that the next bit of the string is either a 0 or a 1, which may be based on previous bits of the string. The next bit may then be encoded by selecting a new range to take place of the previous range of X. Generally, the upper and lower limits are represented in three segments. The first segment generally has the same base-256 digits and are often presented as the leading bytes of X. The next segment is generally stored in memory which the first digit in the segment varies from the remaining digits. The remaining segment is generally assumed to be zeros for the lower limit and ones for the upper limit. In one embodiment, compression may cease when one or more bytes are written from the lower bound of X.

Figure 1C:
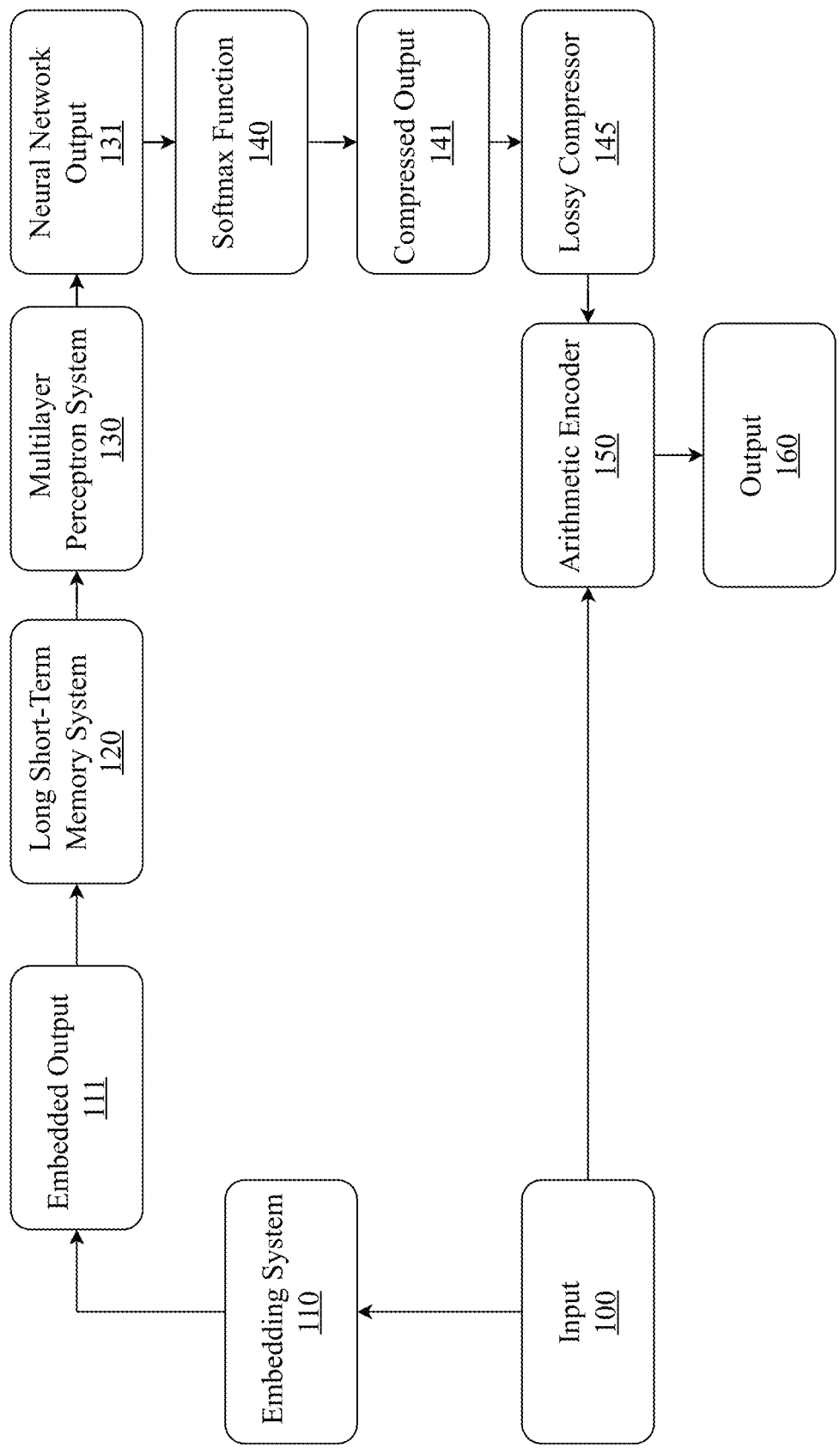
FIG. 1C is a block diagram illustrating an exemplary system architecture for learning-based, controllable lossy data compression.

FIG. 1C is a block diagram illustrating an exemplary system architecture for learning-based, controllable lossy data compression. In one embodiment, the system and method may comprise an input 100, an embedding system 110, an embedded output 111, a long short-term memory system (LSTM) 120, a multilayer perceptron system 130, a neural network output 131, a SoftMax function 140, a first compressed output 141, a lossy compressor 145, an arithmetic encoder 150, and a second compressed output 160. In one embodiment, the embedding system 110 receives the input 100 or plurality of inputs 100 from a source. The input 100 may include, but is not limited to a text file, a video file, an audio file, or any other file which includes a plurality of information. The embedding system 110 prepares an input 100 for further processing by a plurality of neural network systems. The embedding system 110 turns the input 100 into an embedded output 111 which may then be processed by a long short-term memory system 120.

In one embodiment, the long short-term memory system 120 is a plurality of recurring neural network architectures which further processes the embedded output 111 for compression. The LSTM 120 is a special kind of recurring neural network where the present output depends on the LSTM's understanding of the previous output. The LSTM 120 is capable of learning long term dependency through the use of a plurality of gates that allows the LSTM 120 to add and remove information to a cell state. After an embedded output 111 is processed by the LSTM 120, the embedded output 111 is processed by the multilayer perceptron system 130. The multilayer perceptron system (MLP) 130 is a neural network which uses a PAQ algorithm to achieve data compression. A PAQ algorithm refers to a plurality of lossless data compression algorithms which are exceptionally effective and have high compression ratios for many different data types. In one embodiment, the MLP 130 may be a shallow MLP where a plurality of inputs are operated on by a plurality of weights which creates a large linear plurality of hidden nodes which are grouped into sets. The plurality of hidden nodes may be operated on a small plurality of additional weights which converges the hidden nodes into a single output node. A key feature of a shallow MLP 130 is that the plurality of hidden nodes are operated on by the additional weights in one step, rather than a plurality of steps. In one embodiment, the embedded output 111 which has been processed by the LSTM 120 is transformed by the MLP 130 which may be a shallow MLP 130 into a neural network output 131. The neural network output 131 may then be operated on by a SoftMax function 140 which generates a compressed output 141. The compressed output 141 is a compressed version of the input 100 where no information has been lost during the compression process.

In another embodiment, the first compressed output 141 may then be passed to a lossy compressor 145 which may be implemented differently, according to various embodiments. Examples of lossy compression algorithms/systems can include, but are not limited to, quantization, thresholding, perceptual loss, rate-distortion optimization, adaptive quantization, and various post-processing techniques.

The lossy compressed data may then be passed to an arithmetic encoder 150 which may also receive the input 100. The arithmetic encoder 150 may generate a probability output by analyzing and processing the input 100 and the lossy compressed output. The arithmetic encoder 150 may also receive the input 100 and the lossy compressed output where it generates a second compressed output 160. Generally, an arithmetic encoder receives a string with a length which is compressed to the shortest byte string which represents a number (X) within a particular range. In some embodiments, the arithmetic encoder 150 may be an arithmetic encoder in PAQ. An arithmetic encoder in PAQ maintains for each prediction an upper and lower limit on X. Concluding each prediction, the current range of X is split into parts representing the probabilities that the next bit of the string is either a 0 or a 1, which may be based on previous bits of the string. The next bit may then be encoded by selecting a new range to take place of the previous range of X. Generally, the upper and lower limits are represented in three segments. The first segment generally has the same base-256 digits and are often presented as the leading bytes of X. The next segment is generally stored in memory which the first digit in the segment varies from the remaining digits. The remaining segment is generally assumed to be zeros for the lower limit and ones for the upper limit. In one embodiment, compression may cease when one or more bytes are written from the lower bound of X.

Figure 1D:
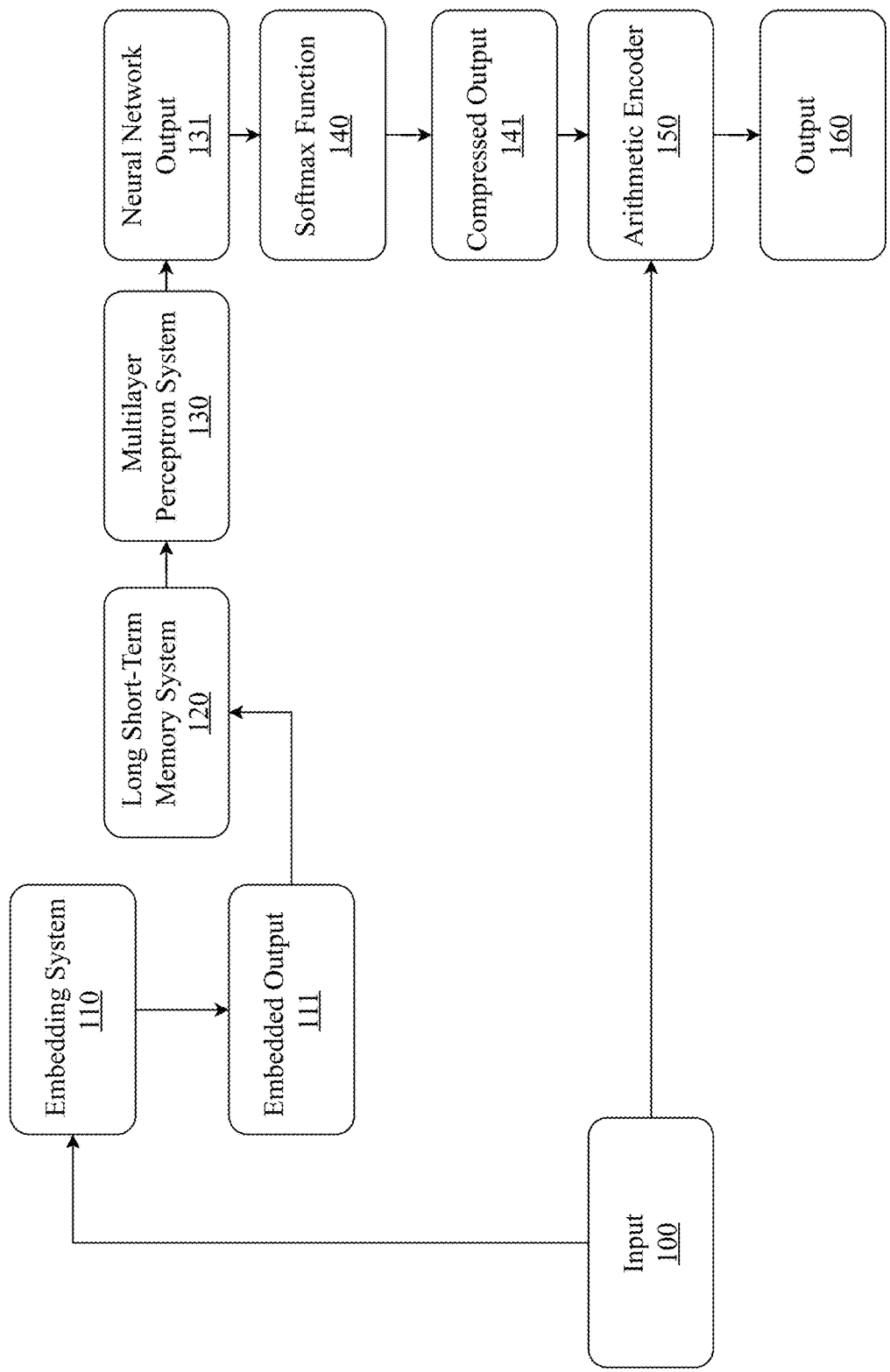
FIG. 1D is a block diagram illustrating an exemplary system architecture for learning-based lossless data compression.

FIG. 1D is a block diagram illustrating an exemplary system architecture for learning-based lossless data compression. In one embodiment, the system and method may comprise an input 100, an embedding system 110, an embedded output 111, a long short-term memory system (LSTM) 120, a multilayer perceptron system 130, a neural network output 131, a SoftMax function 140, a first compressed output 141, an arithmetic encoder 150, and a second compressed output 160. In one embodiment, the embedding system 110 receives the input 100 or plurality of inputs 100 from a source. The input 100 may include, but is not limited to a text file, a video file, an audio file, or any other file which includes a plurality of information. The embedding system 110 prepares an input 100 for further processing by a plurality of neural network systems. The embedding system 110 turns the input 100 into an embedded output 111 which may then be processed by a long short-term memory system 120.

In one embodiment, the long short-term memory system 120 is a plurality of recurring neural network architectures which further processes the embedded output 111 for compression. The LSTM 120 is a special kind of recurring neural network where the present output depends on the LSTM's understanding of the previous output. The LSTM 120 is capable of learning long term dependency through the use of a plurality of gates that allows the LSTM 120 to add and remove information to a cell state. After an embedded output 111 is processed by the LSTM 120, the embedded output 111 is processed by the multilayer perceptron system 130. The multilayer perceptron system (MLP) 130 is a neural network which uses a PAQ algorithm to achieve data compression. A PAQ algorithm refers to a plurality of lossless data compression algorithms which are exceptionally effective and have high compression ratios for many different data types. In one embodiment, the MLP 130 may be a shallow MLP where a plurality of inputs are operated on by a plurality of weights which creates a large linear plurality of hidden nodes which are grouped into sets. The plurality of hidden nodes may be operated on a small plurality of additional weights which converges the hidden nodes into a single output node. A key feature of a shallow MLP 130 is that the plurality of hidden nodes are operated on by the additional weights in one step, rather than a plurality of steps. In one embodiment, the embedded output 111 which has been processed by the LSTM 120 is transformed by the MLP 130 which may be a shallow MLP 130 into a neural network output 131. The neural network output 131 may then be operated on by a SoftMax function 140 which generates a compressed output 141. The compressed output 141 is a compressed version of the input 100 where no information has been lost during the compression process.

In another embodiment, the first compressed output 141 may then be passed to an arithmetic encoder 150 which may also receive the input 100. The arithmetic encoder 150 may generate a probability output by analyzing and processing the input 100 and the first compressed output 141. The arithmetic encoder 150 may also receive the input 100 and the first compressed output 141 where it generates a second compressed output 160. Generally, an arithmetic encoder receives a string with a length which is compressed to the shortest byte string which represents a number (X) within a particular range. In some embodiments, the arithmetic encoder 150 may be an arithmetic encoder in PAQ. An arithmetic encoder in PAQ maintains for each prediction an upper and lower limit on X. Concluding each prediction, the current range of X is split into parts representing the probabilities that the next bit of the string is either a 0 or a 1, which may be based on previous bits of the string. The next bit may then be encoded by selecting a new range to take place of the previous range of X. Generally, the upper and lower limits are represented in three segments. The first segment generally has the same base-256 digits and are often presented as the leading bytes of X. The next segment is generally stored in memory which the first digit in the segment varies from the remaining digits. The remaining segment is generally assumed to be zeros for the lower limit and ones for the upper limit. In one embodiment, compression may cease when one or more bytes are written from the lower bound of X.

Figure 2:
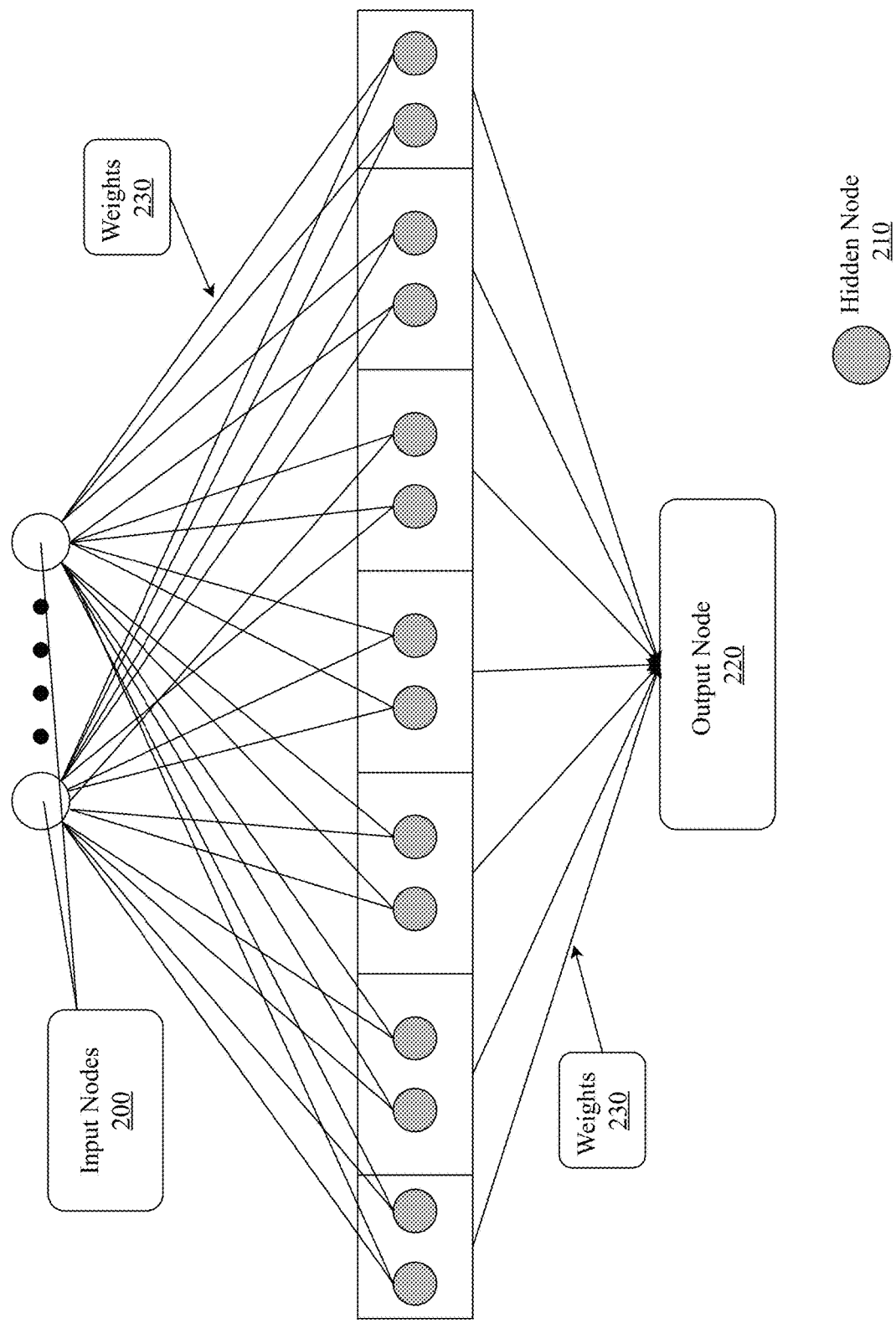
FIG. 2 is a block diagram illustrating an exemplary architecture for a subsystem of the system for learning-based lossless data compression, a multilayer perceptron system.

FIG. 2 is a block diagram illustrating an exemplary architecture for a subsystem of the system for learning-based lossless data compression, a multilayer perceptron system 130. In an embodiment, the multilayer perceptron system 130 may receive a plurality of inputs which begin as input nodes 200. The plurality of input nodes 200 are operated on by a plurality of predetermined weights. The plurality of predetermined weights 230 creates a plurality of hidden nodes 210 which may exist in a grouped sequence. In one embodiment, there may be 552 input nodes where are operated on by 3080 weights. This creates 3080 new hidden nodes which exist in seven sets, each set containing a plurality of hidden nodes 210. Each set of hidden nodes 210 is then operated on by an additional layer of weights 230 which may or may not be similar to the weights used on the input nodes. In embodiment where the hidden nodes 210 exist in seven sets, there will be seven additional weights. The additional weights act on the sets of hidden nodes 210 to create a plurality of output nodes 220.

Figure 3:
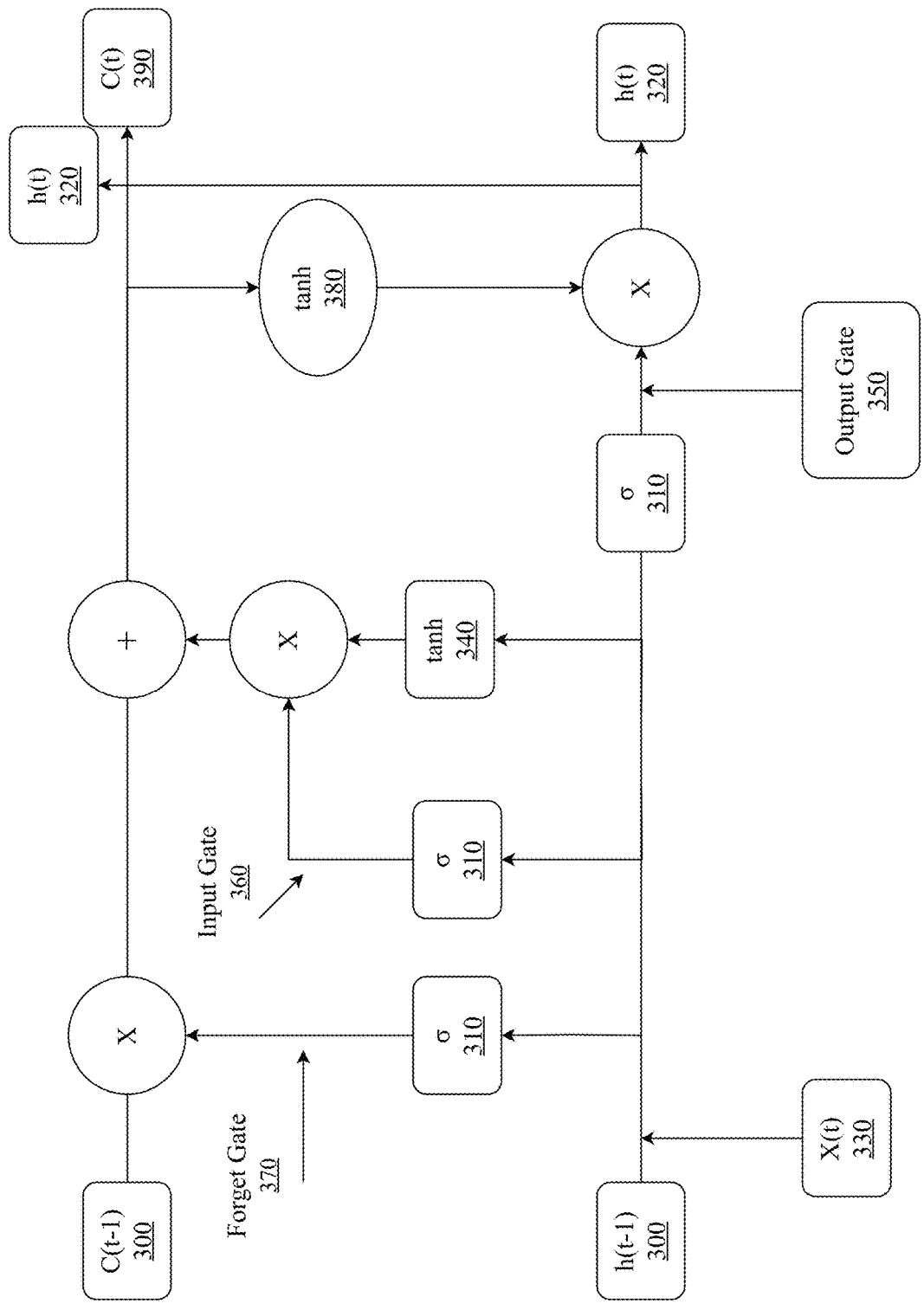
FIG. 3 is a block diagram illustrating an exemplary architecture for a subsystem of the system for learning-based lossless data compression, a long short-term memory system.

FIG. 3 is a block diagram illustrating an exemplary architecture for a subsystem of the system for learning-based lossless data compression, a long short-term memory system 120. In one embodiment, the LSTM system 120 is further comprised of a plurality of functions where the present output depends on understanding the previous output. The LSTM system 120 is capable of learning long term dependency and a plurality of gates allow the system to add and remove information to a cell state. The flow state in FIG. 4 may be governed by the following functions in one embodiment:

$$i_t = \sigma(W_{ix}x_t + W_{ih}h_{t-1} + b_i)$$

$$O_t = \sigma(W_{fx}x_t + W_{fh}h_{t-1} + b_f)$$

$$O_t = \sigma(W_{ox}x_t + W_{oh}h_{t-1} + b_o)$$

$$c_t = f_t \odot c_{t-1} + i_t(\tanh(W_{cx}x_t + W_{ch}h_{t-1} + b_c)$$

$$h_t = O_t \odot \tanh(c_t)$$

Where $i_t$ represents an input gate 360, $f_t$ represents a forget gate 370, and $O_t$ represents an output gate 350. The forget gate 370 allows the system to remove information from a cell state, the input gate 360 allows the system to add information to a cell state, and the output gate 350 allows the system to output information from a cell state.

According to some embodiments, the LSTM system may be configured to operate with one or more attention mechanisms to better capture the temporal dependencies within a given input dataset. Exemplary attention mechanisms can include, but are not limited to, additive attention, multiplicative attention, self-attention, hierarchical attention, temporal attention, and spatial attention. These are just a few examples of attention mechanisms that could be implemented with the LSTM in the controllable lossy compression system. The choice of attention mechanism depends on the specific requirements of the system, such as the type of input data, the desired level of granularity, and the computational constraints. Attention mechanisms can help the LSTM to focus on the most relevant parts of the input data, improving the compression efficiency and the quality of the reconstructed output. By selectively attending to different spatial regions, temporal scales, or levels of granularity, the LSTM can better capture the important patterns and dependencies in the input data, leading to improved compression performance.

Additive attention, also known as Bahdanau attention, computes attention weights based on the compatibility between the LSTM hidden states and a learnable attention query vector. The attention weights are computed using a feedforward neural network that takes the concatenation of the LSTM hidden state and the attention query vector as input. The attention weights are then used to compute a weighted sum of the LSTM hidden states, which forms the context vector. The context vector is concatenated with the current LSTM hidden state to make the final prediction or to generate the next output.

Multiplicative attention, also known as Luong attention, computes attention weights based on the dot product between the LSTM hidden states and a learnable attention weight matrix. The attention weights are computed by multiplying the LSTM hidden states with the attention weight matrix and applying a softmax function to obtain a probability distribution over the input sequence. The attention weights are then used to compute a weighted sum of the LSTM hidden states, which forms the context vector. The context vector is concatenated with the current LSTM hidden state or used to directly influence the LSTM output.

Self-attention allows the LSTM to attend to different positions of its own input sequence. In self-attention, the LSTM hidden states are transformed into query, key, and value vectors using learnable weight matrices. The attention weights are computed by taking the dot product between the query vector and the key vectors, followed by a softmax function. The attention weights are then used to compute a weighted sum of the value vectors, which forms the self-attended representation. The self-attended representation can be concatenated with the LSTM hidden state or used as an additional input to the LSTM.

Hierarchical attention allows the LSTM to attend to different levels of granularity in the input data. In the context of the controllable lossy compression system, hierarchical attention can be applied to attend to different spatial scales or temporal scales of the input data. For example, the LSTM can have separate attention mechanisms for attending to fine-grained local features and coarse-grained global features. The attention weights at different scales can be computed using separate attention modules and then combined to form the final context vector.

Temporal attention allows the LSTM to attend to different time steps of the input sequence based on their relevance to the current prediction. In the controllable lossy compression system, temporal attention can be used to selectively focus on the most informative frames or time steps in the input data. The attention weights can be computed based on the compatibility between the LSTM hidden state at the current time step and the hidden states at previous time steps. The attention weights are then used to compute a weighted sum of the LSTM hidden states across time, forming a temporal context vector.

Spatial attention allows the LSTM to attend to different spatial regions of the input data based on their importance. In the controllable lossy compression system, spatial attention can be used to focus on the most informative regions of the input images or feature maps. The attention weights can be computed based on the compatibility between the LSTM hidden state and the spatial features at different locations. The attention weights are then used to compute a weighted sum of the spatial features, forming a spatial context vector.

Detailed Description of Exemplary Aspects

Figure 4:
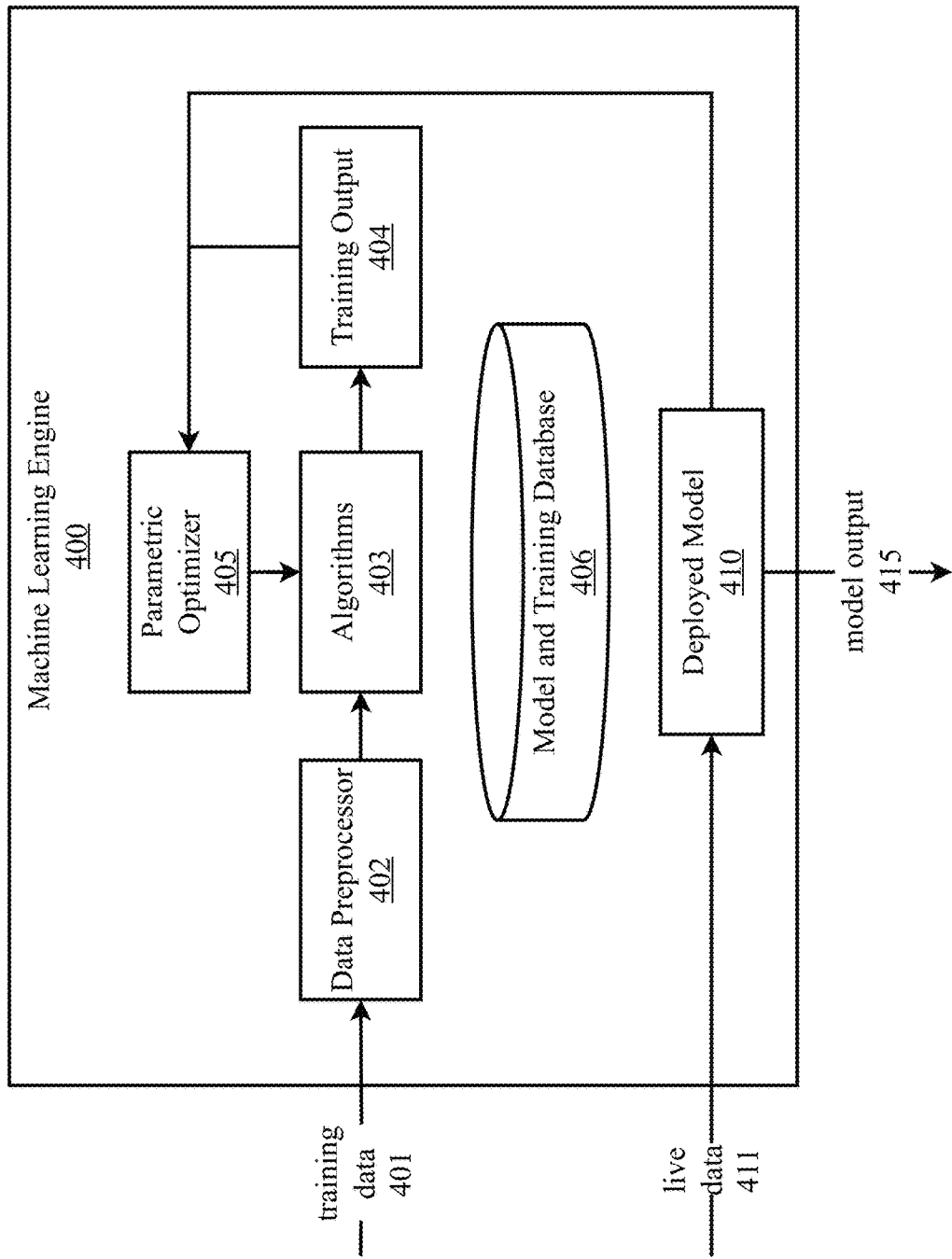
FIG. 4 is a block diagram illustrating an exemplary machine learning model for either the multilayer perceptron system or the long short-term memory system.

FIG. 4 is a block diagram illustrating an exemplary machine learning model for either the multilayer perceptron system or the long short-term memory system. According to the embodiment, the multilayer perceptron system 130 or the long short-term memory system 120 may comprise a machine learning engine 400 which may further comprise a model training stage comprising a data preprocessor 402, one or more machine and/or deep learning algorithms 403, training output 404, and a parametric optimizer 405, and a model deployment stage comprising a deployed and fully trained model 410 configured to perform tasks described herein such as transcription, summarization, agent coaching, and agent guidance. Machine learning engine 400 may be used to train and deploy a long short-term memory system 120 and the multilayer perceptron system 130 in order to support the services provided by the lossless data compression system.

At the model training stage, a plurality of training data 401 may be received by the machine learning engine 400. In some embodiments, the plurality of training data may be obtained from one or more database(s) 108 and/or directly from various information sources such as a plurality of contact centers 120. In a use case, a plurality of training data may be sourced TT&C satellite subsystems. It could include text files, audio or video files, or other forms of data. Data preprocessor 402 may receive the input data and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 402 may also be configured to create training dataset, a validation dataset, and a test set from the plurality of input data 401. For example, a training dataset may comprise 80% of the preprocessed input data, the validation set 10%, and the test dataset may comprise the remaining 10% of the data. The preprocessed training dataset may be fed as input into one or more machines and/or deep learning algorithms 403 to train a predictive model for object monitoring and detection.

During model training, training output 404 is produced and used to measure the accuracy and usefulness of the predictive outputs. During this process a parametric optimizer 405 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop. In some implementations, various accuracy metrics may be used by machine learning engine 400 to evaluate a model's performance. Metrics can include, but are not limited to, information loss, latency, and resource consumption.

A model and training database 406 is present and configured to store training/test datasets and developed models. Database 406 may also store previous versions of models. According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 403 may comprise a deep learning algorithm such as neural networks (e.g., recurrent, convolutional, long short-term memory networks, etc.).

In some implementations, ML engine 400 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in model and training database 406.

Figure 5:
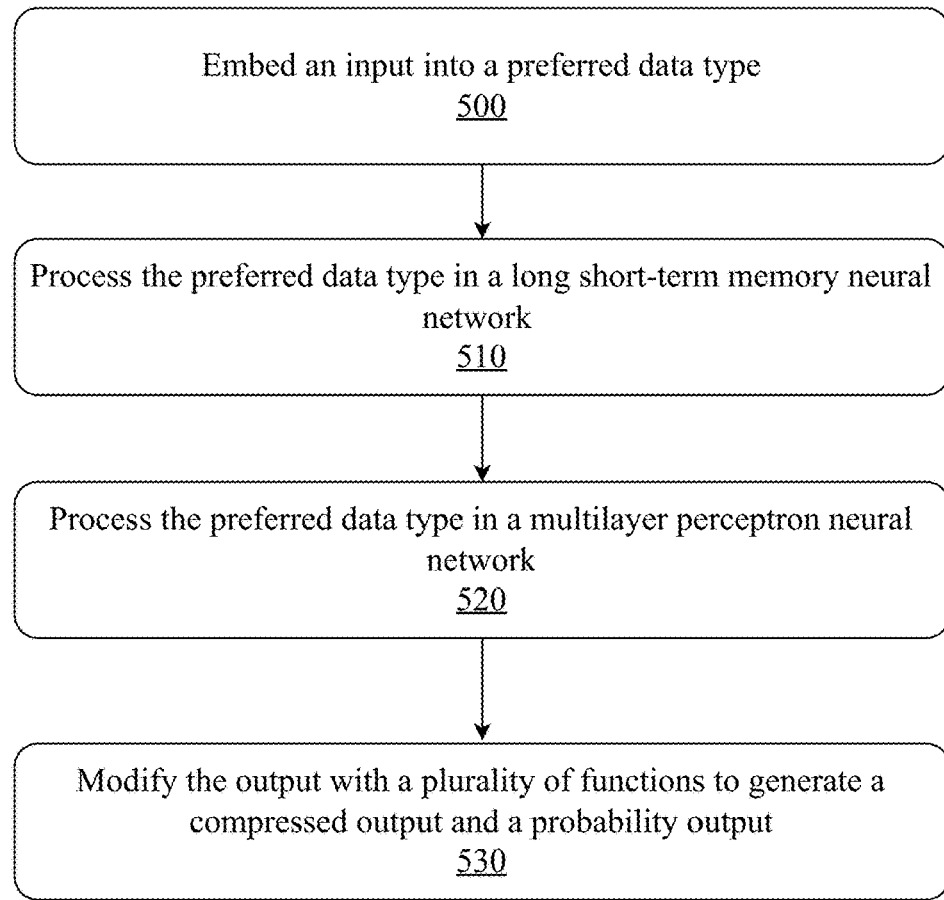
FIG. 5 is a flow diagram illustrating an exemplary method of learning-based data compression.

FIG. 5 is a flow diagram illustrating an exemplary method of learning-based data compression. In a first step 500, embed an input into a preferred data type. The input may be a data type including but not limited to, text files, audio files, video files, and any other data type which carries information. In a step 510, process the preferred data type in a long short-term memory neural network. In a step 520, process the preferred data type in a multilayer perceptron neural network which creates an output. In a step 530, modify the output with a plurality of functions to generate a compressed output and a probability output. The plurality of functions may include a SoftMax function and an arithmetic encoding algorithm.

Figure 6:
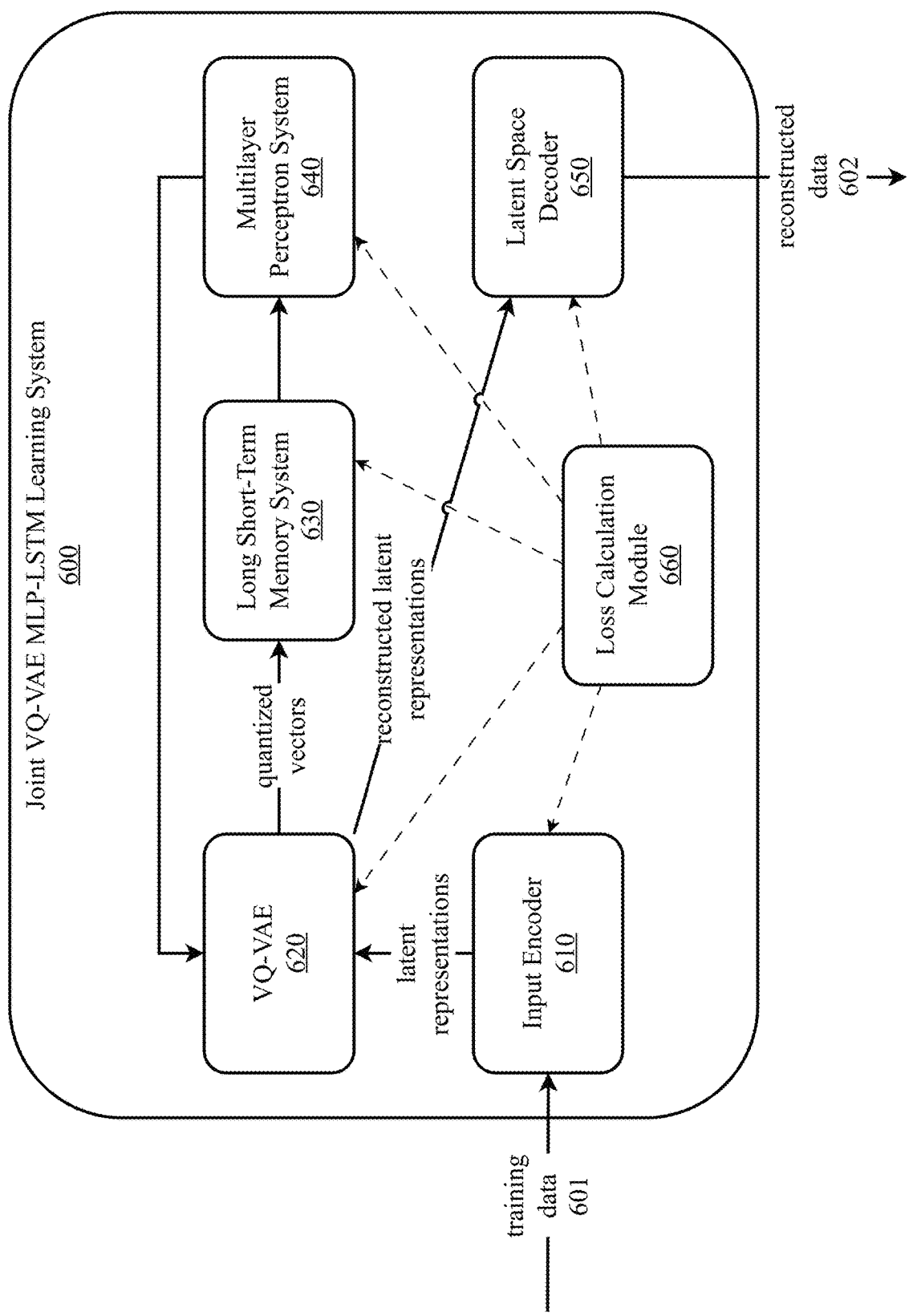
FIG. 6 is a block diagram illustrating an exemplary architecture for training a joint learning system for the end-to-end VQ-VAE MLP-LSTM system, according to an embodiment.

FIG. 6 is a block diagram illustrating an exemplary architecture for training a joint learning system for the end-to-end VQ-VAE MLP-LSTM system, according to an embodiment. According to an embodiment, the joint learning system comprises an input encoder 610, a VQ-VAE 620 which further comprises an encoder, a vector quantization layer, and a decoder, a LSTM network 630, a MLP network 640, a latent space decoder 650, and a loss calculation module 660 which computes the total loss for the joint learning system and backpropagates (the dashed lines) system parameter/hyperparameter updates based on an training objective optimization process. The joint learning system takes in a plurality of training data 601 and learns to output reconstructed data 602. According to an aspect, joint training may be implemented with the help of machine learning engine 400.

Let's consider a practical example of training data and how it transforms as it moves through the various components of the joint learning system. For this example, the training data comprises the use of a time series dataset of stock prices. Suppose the dataset consists of daily stock prices for a particular company over a period of time. Each data point includes the date, opening price, closing price, high price, low price, and trading volume. The dataset is preprocessed and normalized to ensure consistency and scale. Example data point: Date: 2023 Jun. 1 Open: 100.5 Close: 102.3 High: 103.1 Low: 99.8 Volume: 500000.

The input encoder 610, which can be a fully connected network or a convolutional neural network, takes the preprocessed stock price data as input. Its purpose is to extract meaningful features and patterns from the raw data and map them to a lower-dimensional latent space. In this case, the input encoder may learn to capture patterns such as trend, volatility, and volume dynamics from the stock price data. It encodes these patterns into a compact latent representation. Encoded latent representation: [0.8, −0.2, 0.5, 0.1, . . . ].

The VQ-VAE 620 consists of an encoder, a vector quantization layer, and a decoder. The encoded latent representation from the input encoder 610 is passed through the VQ-VAE encoder, which further compresses it into a more compact form. The vector quantization layer then discretizes the compressed representation into a finite set of vectors from a learned codebook. Each latent vector is assigned to the nearest codebook vector, introducing quantization. Quantized representation: [codebook_index_1, codebook_index_2, . . . ].

The quantized representation from the VQ-VAE is fed into the MLP-LSTM system. The MLP-LSTM is designed to capture and model the temporal dependencies and patterns in the quantized stock price data. The LSTM 630 component learns to capture long-term dependencies and temporal dynamics, while the MLP 640 component learns to extract higher-level features and patterns. MLP-LSTM output: [predicted_price_1, predicted_price_2, . . . ].

The output from the MLP-LSTM is passed through the VAE decoder, which reconstructs the original latent representation from the quantized and temporally modeled representation. The VAE decoder learns to map the MLP-LSTM output back to the original latent space, taking into account the information loss introduced by the quantization process. Reconstructed latent representation: [0.82, −0.18, 0.52, 0.09, . . . ].

Finally, the reconstructed latent representation is passed through an output decoder 650, which maps it back to the original data space. In this case, the output decoder generates a reconstructed version 602 of the stock price data, including the opening price, closing price, high price, low price, and volume. Reconstructed stock price data: Date: 2023 Jun. 1 Open: 100.8 Close: 102.1 High: 103.3 Low: 99.6 Volume: 510000.

The reconstructed stock price data is an approximation of the original input data, taking into account the compression, quantization, and temporal modeling performed by the joint learning system. Throughout the training process, the joint learning system learns to optimize the reconstruction quality, compression efficiency, and temporal modeling accuracy by minimizing the reconstruction loss, quantization loss, and temporal modeling loss via the loss calculation module 660. The joint system is optimized end-to-end using backpropagation and gradient descent techniques. The gradients may be computed with respect to all the learnable parameters in the input encoding system, VQ-VAE, MLP-LSTM, and latent space decoder.

By training on a large dataset of historical stock price data, the joint learning system can learn to effectively compress, model, and reconstruct stock price time series, enabling tasks such as stock price prediction, anomaly detection, or generating synthetic stock price data. This is just one example of how training data 601 can be used and transformed in the joint learning system. The specific transformations and learned representations may vary depending on the type of input data and the problem domain, but the general flow of data through the input encoder, VQ-VAE, MLP-LSTM, and latent decoder remains the same.

Figure 7:
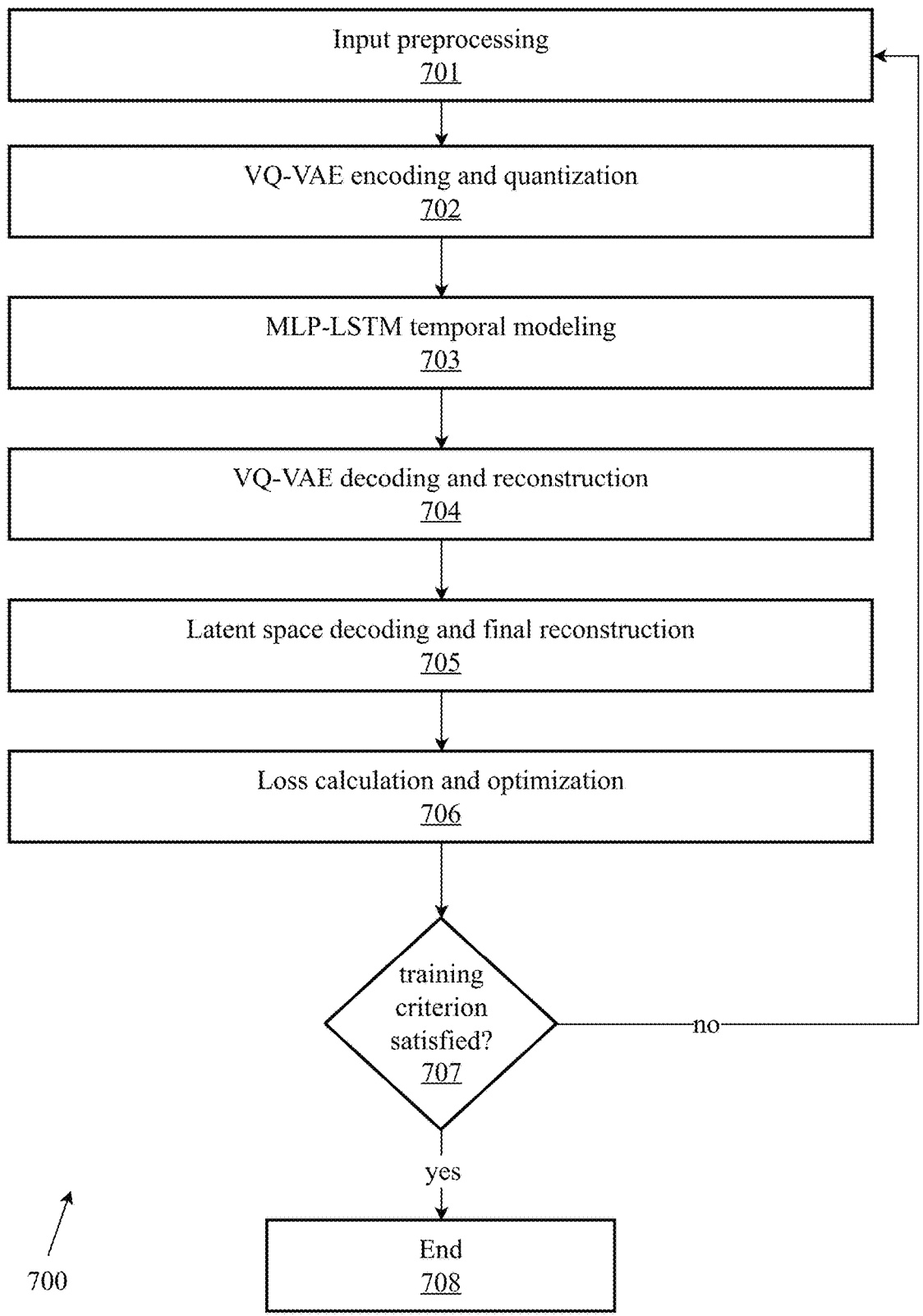
FIG. 7 is a flow diagram illustrating an exemplary method for jointly training an end-to-end system for controllable lossy compression comprising in input encoder, a VQ-VAE, an MLP-LSTM, and a latent space decoder, according to an embodiment.

FIG. 7 is a flow diagram illustrating an exemplary method 700 for jointly training an end-to-end system for controllable lossy compression comprising in input encoder, a VQ-VAE, an MLP-LSTM, and a latent space decoder, according to an embodiment. The joint learning process involves training all the components of the system together to optimize the entire pipeline for compression, temporal modeling, and reconstruction. According to the embodiment, the process begins at step 701 with input preprocessing wherein the raw input data is preprocessed by the input encoding system which may be, for example, a CNN or a fully connected network. The input encoding system learns to extract meaningful features from the input data and maps them to a lower-dimensional latent space. The preprocessed input is then passed to the VQ-VAE encoder.

In some embodiments, a data pre-processor system may be present and configured to perform various data preprocessing operations on the raw input data prior to being fed into an input encoder. Operations can include, but are not limited to, normalization such as scaling the input data to a specific range (e.g., between 0 and 1) to ensure consistent input to the encoding system, noise reduction such as applying filters or algorithms to remove noise or unwanted artifacts from the input data, such as denoising images or audio signals, data augmentation such as generating additional training samples by applying transformations to the input data, such as rotation, scaling, or flipping, to improve the robustness of the compression system, feature extraction wherein relevant features or representations are extracted from the input data, such as edge detection or frequency analysis, to provide more informative inputs to the encoding system, and dimensionality reduction such reducing the dimensionality of the input data using techniques like Principal Component Analysis (PCA) or t-SNE to improve computational efficiency and reduce redundancy.

At step 702 the joint system performs VQ-VAE encoding and quantization. The VQ-VAE encoder further compresses the latent representation obtained from the input encoding system. The compressed representation is then discretized by the vector quantization layer into a finite set of vectors from a learned codebook. The vector quantization layer introduces a quantization error, which is used as a regularization term in the training objective.

At step 703, the joint system performs temporal modeling using the MLP-LSTM. The quantized vectors from the VQ-VAE are fed into the MLP-LSTM system. The MLP-LSTM learns to model the temporal dependencies and patterns in the quantized representations. It captures the sequential information and generates outputs based on the learned temporal dynamics. At step 704, the joint system performs VQ-VAE decoding and reconstruction. The output from the MLP-LSTM is passed through the VQ-VAE decoder. The VQ-VAE decoder reconstructs the latent representation from the MLP-LSTM output, taking into account the lossy compression introduced by the vector quantization. The reconstructed latent representation is then fed into the latent space decoder. At step 705, the latent space decoder takes the reconstructed latent space representation as input and maps it back to the original input data space. It generates a reconstructed version of the raw input data based on the reconstructed latent representation. The reconstructed raw input data is an approximation of the original input data, considering the information loss during the compression and reconstruction process.

At step 706, the joint system performs loss calculation and model optimization operations. The training objective is a mathematical formulation that defines the goal of the joint learning process. It consists of a combination of loss terms that capture different aspects of the system's performance. The training objective is minimized during the optimization process to learn the optimal parameters of the system. According to the embodiment, the training objective comprises multiple loss terms; reconstruction loss which measures the difference between the reconstructed raw input data and the original input data and which encourages the joint system to generate accurate reconstructions; quantization loss which measures the error introduced by the vector quantization process and which encourages the joint system to learn a meaningful and representative codebook; and temporal modeling loss which measures the ability of the MLP-LSTM to capture and predict the temporal dependencies in the quantized representations. The total loss may be computed as a weighted sum of these individual loss terms:

$$\text{Total Loss} = w\_r * \text{Reconstruction Loss} + w\_q * \text{Quantization Loss} + w\_t * \text{Temporal Modeling Loss}$$

Where, w_r, w_q, and w_t are the weights assigned to each loss term, allowing for adjusting their relative importance in the overall optimization process.

The joint system is optimized end-to-end using backpropagation and gradient descent techniques. The gradients may be computed with respect to all the learnable parameters in the input encoding system, VQ-VAE, MLP-LSTM, and latent space decoder. Common measures for reconstruction error include mean squared error (MSE), mean absolute error (MAE), or perceptual loss functions like structural similarity index (SSIM) for images. The quantization loss may be calculated as the Euclidean distance between the compressed representation and its nearest codebook vector. The specific form of the temporal modeling error depends on the task at hand, such as prediction error for future time steps or reconstruction error for sequence-to-sequence models.

According to an embodiment, the loss calculation steps comprise computing the individual loss terms and combining them into the total loss. A general outline of the loss calculation steps follows. Forward Pass: Input the raw data through the input encoding system, VQ-VAE encoder, vector quantization layer, MLP-LSTM, VQ-VAE decoder, and latent space decoder. Obtain the reconstructed raw input data and the intermediate outputs (compressed representation, quantized vectors, MLP-LSTM output). Reconstruction Loss Calculation: Compare the reconstructed raw input data with the original input data using the chosen reconstruction loss function (e.g., MSE, MAE, SSIM). Compute the reconstruction loss value. Quantization Loss Calculation: Measure the quantization error by calculating the Euclidean distance between the compressed representation and its nearest codebook vector. Compute the quantization loss value. Temporal Modeling Loss Calculation: Evaluate the MLP-LSTM's performance in capturing temporal dependencies based on the specific task (e.g., prediction error, classification loss). Compute the temporal modeling loss value. Total Loss Calculation: Multiply each individual loss term by its corresponding weight (w_r, w_q, w_t). Sum up the weighted loss terms to obtain the total loss value. Backward Pass and Optimization: Compute the gradients of the total loss with respect to the learnable parameters of the system using backpropagation. Update the parameters using an optimization algorithm (e.g., stochastic gradient descent, Adam) to minimize the total loss. The loss calculation steps are performed iteratively during the training process, and the system's parameters are updated based on the gradients to improve its performance. It should be noted that the specific formulation of the loss terms and their weights can vary depending on the problem domain, the nature of the input data, and the desired trade-offs between reconstruction quality, compression efficiency, and temporal modeling accuracy. Hyperparameter tuning and experimentation are often required to find the optimal balance for a given application.

In the joint learning system of the VQ-VAE MLP-LSTM end-to-end model, there are several hyperparameters that can be tuned to optimize the system's performance. Some examples of the types of hyperparameters involved are as follows.

Latent Space Dimensionality: The dimensionality of the latent space determines the size of the compressed representation. It controls the trade-off between compression efficiency and reconstruction quality. A lower dimensionality leads to higher compression but may result in loss of detail, while a higher dimensionality preserves more information but reduces compression.

Codebook Size: The codebook size refers to the number of discrete vectors in the vector quantization layer of the VQ-VAE. It determines the granularity of the quantization process and affects the reconstruction quality and compression efficiency. A larger codebook size allows for more precise quantization but increases computational complexity and memory requirements.

MLP-LSTM Architecture: The architecture of the MLP-LSTM, including the number of layers, hidden units, and activation functions, can be adjusted. These hyperparameters impact the capacity of the MLP-LSTM to capture temporal dependencies and model complex patterns. Deeper and wider architectures may improve temporal modeling accuracy but increase computational cost.

Learning Rate: The learning rate determines the step size at which the model's parameters are updated during optimization. It controls the speed and stability of the learning process. A higher learning rate may lead to faster convergence but can also cause instability, while a lower learning rate ensures more stable learning but may slower convergence.

Batch Size: The batch size defines the number of samples processed together in each iteration of training. It affects the memory usage and computational efficiency of the training process. Larger batch sizes can accelerate training but may require more memory, while smaller batch sizes allow for more frequent parameter updates but may introduce more noise.

Regularization Techniques: Regularization techniques, such as L1/L2 regularization or dropout, can be applied to prevent overfitting and improve generalization. These hyperparameters control the strength of the regularization and help balance the model's complexity and its ability to generalize to unseen data.

Loss Weights: The weights assigned to each loss term in the training objective (reconstruction loss, quantization loss, temporal modeling loss) can be adjusted. These weights determine the relative importance of each loss term in the overall optimization process. Balancing the weights can help prioritize different aspects of the system's performance, such as reconstruction quality, compression efficiency, or temporal modeling accuracy.

Number of Training Epochs: The number of training epochs determines how many times the entire dataset is passed through the model during training. It affects the convergence and generalization of the model. More epochs may lead to better performance but also increase the risk of overfitting, while fewer epochs may result in underfitting.

Data Augmentation: Data augmentation techniques, such as rotation, scaling, or noise injection, can be applied to expand the training dataset and improve the model's robustness.

Hyperparameters related to data augmentation control the type and intensity of the transformations applied to the input data.

Optimization Algorithm: The choice of optimization algorithm, such as stochastic gradient descent (SGD), Adam, or RMSprop, can impact the training dynamics and convergence. Each optimization algorithm has its own hyperparameters, such as momentum, decay rates, or adaptive learning rates, which can be tuned to improve training efficiency and stability.

These are just a few examples of the types of hyperparameters involved in the joint learning system. The specific hyperparameters and their optimal values may vary depending on the problem domain, the nature of the input data, and the desired trade-offs between different performance metrics. Hyperparameter tuning is an essential part of the model development process, where different combinations of hyperparameters are explored to find the best configuration that maximizes the system's performance. This can be done through techniques like grid search, random search, or more advanced methods like Bayesian optimization.

A check is made at 707 to determine if the one or more training criterion have been satisfied which may be based on model performance and iteration count. Various evaluation metrics may be implemented to assess the performance of the compression system. This may include metrics like peak signal-to-noise ratio (PSNR), structural similarity index, or domain-specific metrics that measure the perceptual quality or downstream task performance of the reconstructed data. PSNR measures the ratio between the maximum possible power of a signal and the power of the noise that affects the fidelity of its representation. Higher PSNR values indicate better reconstruction quality. (SSIM) measures the perceived similarity between the original and reconstructed data, taking into account luminance, contrast, and structural information. SSIM values range from 0 to 1, with higher values indicating better perceptual quality. Bits Per Pixel (BPP) measures the average number of bits required to represent each pixel in the compressed data. Lower BPP values indicate higher compression ratios. Mean Opinion Score (MOS) is a subjective metric that involves human evaluators rating the quality of the reconstructed data on a scale (e.g., 1-5). Higher MOS values indicate better perceptual quality. Depending on the application, domain-specific metrics may be used to evaluate the performance of the compression system. For example, in a speech compression system, metrics like the Perceptual Evaluation of Speech Quality (PESQ) or the Short-Time Objective Intelligibility (STOI) can be used to assess the intelligibility and quality of the reconstructed speech.

For example, to evaluate the performance of an image compression system, the system may use PSNR and SSIM as the main evaluation metrics. The system can measure the PSNR between the original and reconstructed images to quantify the reconstruction quality, and also compute the SSIM to assess the perceptual similarity between the original and reconstructed images. Additionally, the system can report the BPP to indicate the compression ratio achieved by the system. For a more comprehensive evaluation, the system may also conduct a subjective study where human evaluators rate the quality of the reconstructed images using MOS.

If the training criterion is not satisfied, then the joint system iterates back through the training process and performs fine-tuning. The joint learning process is performed iteratively for multiple epochs. During each epoch, the joint system processes batches of input data, performs forward and backward passes, and updates the model parameters based on the computed gradients. The system learns to jointly optimize the compression, temporal modeling, and reconstruction tasks. Fine-tuning techniques, such as learning rate scheduling and early stopping, can be applied to improve convergence and prevent overfitting. When the training criterion has been satisfied, the process ends at step 708 and the jointly trained systems can be deployed in a production environment.

By jointly learning all the components of the system, the VQ-VAE MLP-LSTM end-to-end system can achieve a balance between compression efficiency, temporal modeling accuracy, and reconstruction quality. The joint optimization allows the system to adapt to the specific characteristics of the input data and learn meaningful representations that capture both the spatial and temporal dependencies. The inclusion of the latent space decoder enables the system to generate interpretable reconstructions of the raw input data, making it suitable for a wide range of applications, such as data compression, anomaly detection, and data generation. It should be noted that the specific architectures and hyperparameters of each component (input encoding system, VQ-VAE, MLP-LSTM, and latent space decoder) can be adjusted based on the nature of the input data and the desired trade-offs between compression ratio, reconstruction quality, and computational efficiency.

Figure 8:
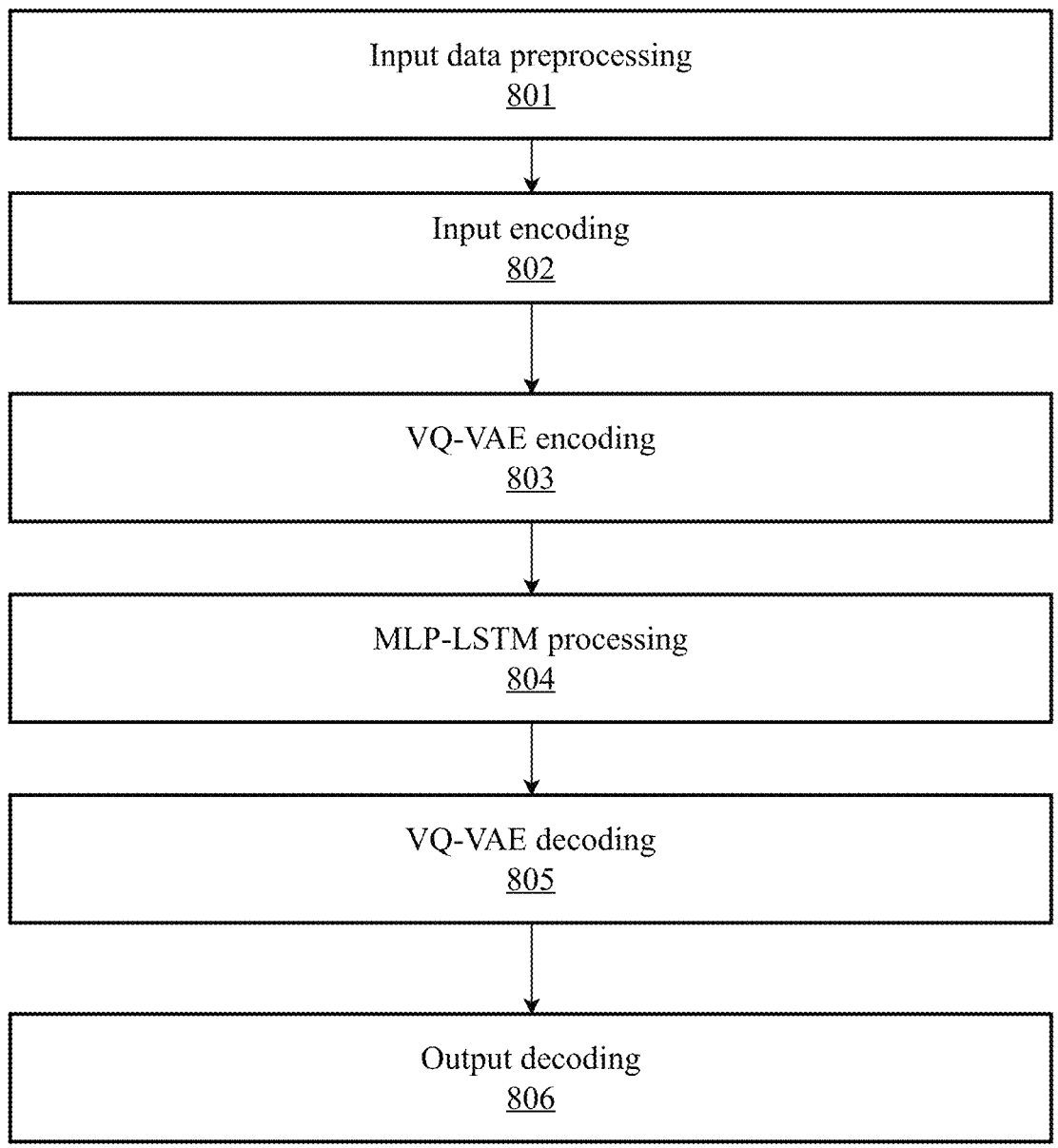
FIG. 8 is a flow diagram illustrating an exemplary method for performing controllable lossy compression, according to an embodiment.

FIG. 8 is a flow diagram illustrating an exemplary method 800 for performing controllable lossy compression, according to an embodiment. Consider an example of processing a set of medical images (e.g., MRI scans) through a controllable lossy compression system. The input data comprises a series of MRI scans, each representing a 3D volume of the brain. Each MRI scan has a spatial resolution of 256×256×128 voxels, with each voxel representing a grayscale intensity value. At step 801 the input data is preprocessed by normalizing the intensity values to a range of [0, 1] and resizing the volumes to a consistent size of 128×128×64 voxels. At step 802, the preprocessed MRI scans are passed through the input encoding system, which is 3D convolutional neural network (CNN). The 3D CNN applies a series of convolutional and pooling layers to extract hierarchical features from the input volumes. The output of the input encoding stage is a set of feature maps that capture the spatial and temporal patterns in the MRI scans. The feature maps have a reduced spatial resolution (e.g., 32×32×16) and an increased number of channels (e.g., 128 channels).

At step 803, the feature maps from the input encoding stage are passed through a VQ-VAE encoder. The VQ-VAE encoder consists of additional convolutional layers that further compress the feature maps into a compact representation. The output of the VQ-VAE encoder is a set of compressed feature maps with a reduced spatial resolution (e.g., 8×8×4) and a reduced number of channels (e.g., 64 channels). The compressed feature maps are then passed through the vector quantization layer, which maps each feature vector to the nearest codebook vector. The codebook is learned during training and consists of a fixed number of representative vectors (e.g., 256 codebook vectors). The output of the vector quantization layer is a set of discrete indices that represent the assigned codebook vectors for each feature vector.

At step 804, the discrete indices from the vector quantization layer are passed through the MLP-LSTM system for temporal modeling. The MLP-LSTM system consists of a series of fully connected layers (MLP) followed by LSTM layers. The MLP layers map the discrete indices to a higher-dimensional space and capture the spatial dependencies within each MRI scan. The LSTM layers model the temporal dependencies across the sequence of MRI scans. The output of the MLP-LSTM system is a set of temporally encoded feature representations that capture the spatial and temporal patterns in the MRI scans.

At step 805, the temporally encoded feature representations from the MLP-LSTM system are passed through the VQ-VAE decoder. The VQ-VAE decoder may consist of transposed convolutional layers that upsample the feature representations and reconstruct the original feature maps. The output of the VQ-VAE decoder is a set of reconstructed feature maps with the same spatial resolution as the compressed feature maps (e.g., 8×8×4) and the same number of channels (e.g., 64 channels).

At step 806, the reconstructed feature maps from the VQ-VAE decoder are passed through the output decoding system (e.g., latent space decoder), which may be another set of transposed convolutional layers. The output decoding system upsamples the reconstructed feature maps to the original spatial resolution of the input MRI scans (e.g., 128×128×64). The final output is a reconstructed version of the original MRI scans, with potential loss of details due to the lossy compression process. The reconstructed MRI scans may be compared with the original MRI scans using evaluation metrics such as PSNR, SSIM, and domain-specific metrics like the Dice coefficient or the Hausdorff distance. The compression ratio is calculated based on the size of the compressed representation (discrete indices) compared to the size of the original MRI scans.

In this example, the MRI scans undergo a series of transformations and data format changes as they pass through the different stages of the controllable lossy compression system. The input encoding and VQ-VAE encoding stages reduce the spatial resolution and compress the data into a compact representation. The MLP-LSTM system models the temporal dependencies and generates temporally encoded features. The VQ-VAE decoding and output decoding stages reconstruct the MRI scans from the compressed representation, resulting in a lossy approximation of the original data.

The intermediate data formats, such as feature maps and discrete indices, represent the compressed and transformed representations of the input data at different stages of the compression pipeline. These intermediate representations are designed to capture the essential information of the input data while reducing the data size for efficient storage and transmission.

Figure 9:
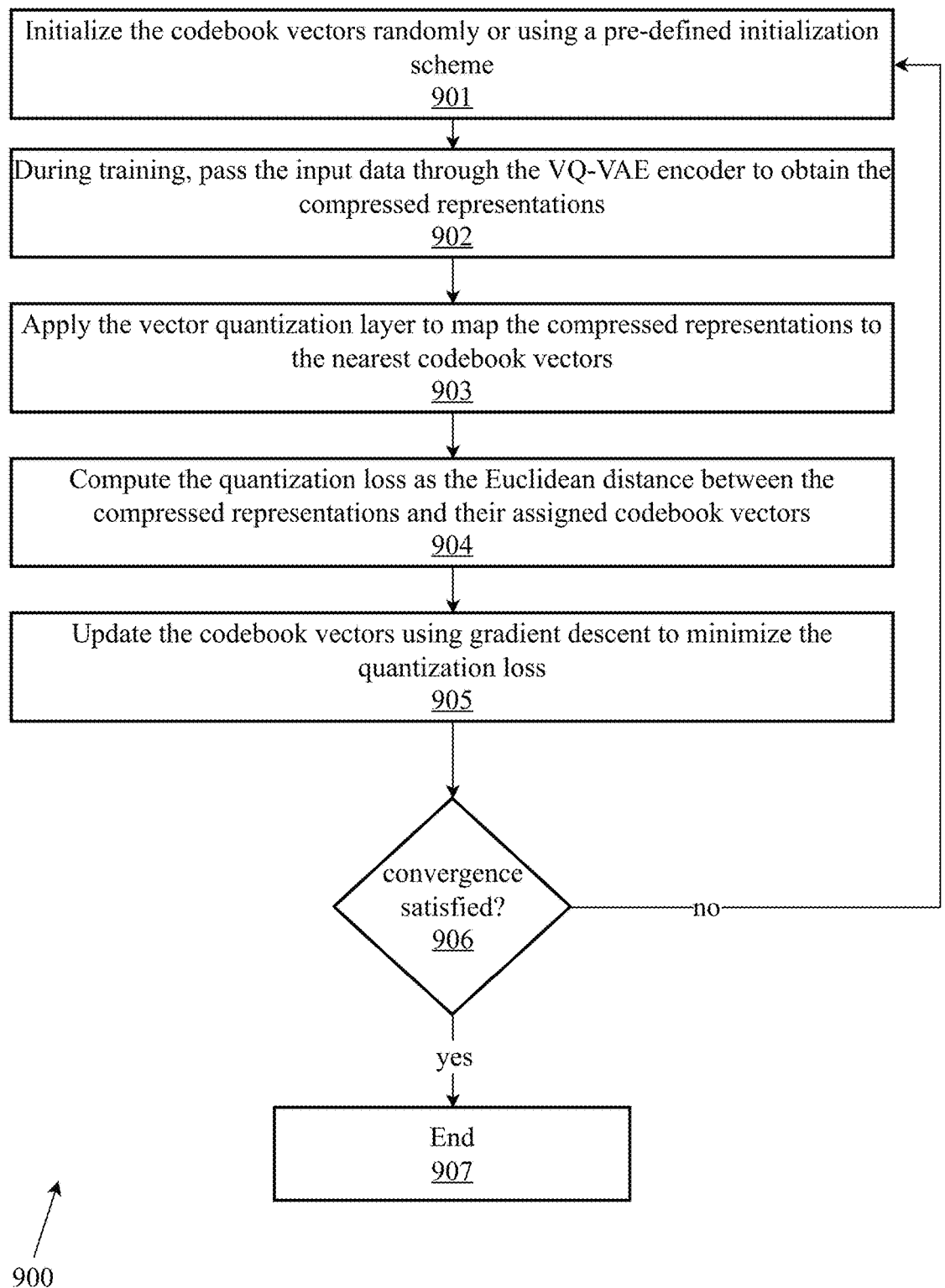
FIG. 9 is a flow diagram illustrating an exemplary method for learning the codebook in the vector quantization layer of the VQ-VAE, according to an embodiment.

FIG. 9 is a flow diagram illustrating an exemplary method 900 for learning the codebook in the vector quantization layer of the VQ-VAE, according to an embodiment. According to the embodiment, the process begins at step 901 by initializing the codebook vectors randomly or using a predefined initialization scheme (e.g., k-means clustering on a subset of the training data). At a step 902, during training, the input data is passed through the VQ-VAE encoder to obtain the compressed representations. At step 903, the vector quantized layer is applied to map the compressed representations to the nearest codebook vectors. At step 904, the system computes the quantization loss as the Euclidean distance between the compressed representations and their assigned codebook vectors. At step 905, the system updates the codebook vectors using gradient descent to minimize the quantization loss. At step 906, a check is made to evaluate the model performance to determine if model convergence has been satisfied. If the performance has not been satisfied, the process is repeated for multiple training epochs until convergence. If the performance is satisfactory, then the process ends at step 907.

Suppose there is a codebook with 256 vectors, each of dimension 64. The system can initialize the codebook vectors randomly. During training, the system passes an image through the VQ-VAE encoder, which compresses it into a 32×32×64 representation. The vector quantization layer maps each 64-dimensional vector to the nearest codebook vector. The system computes the quantization loss and update the codebook vectors to minimize the loss. This process is repeated for multiple epochs until the codebook converges.

Figure 10:
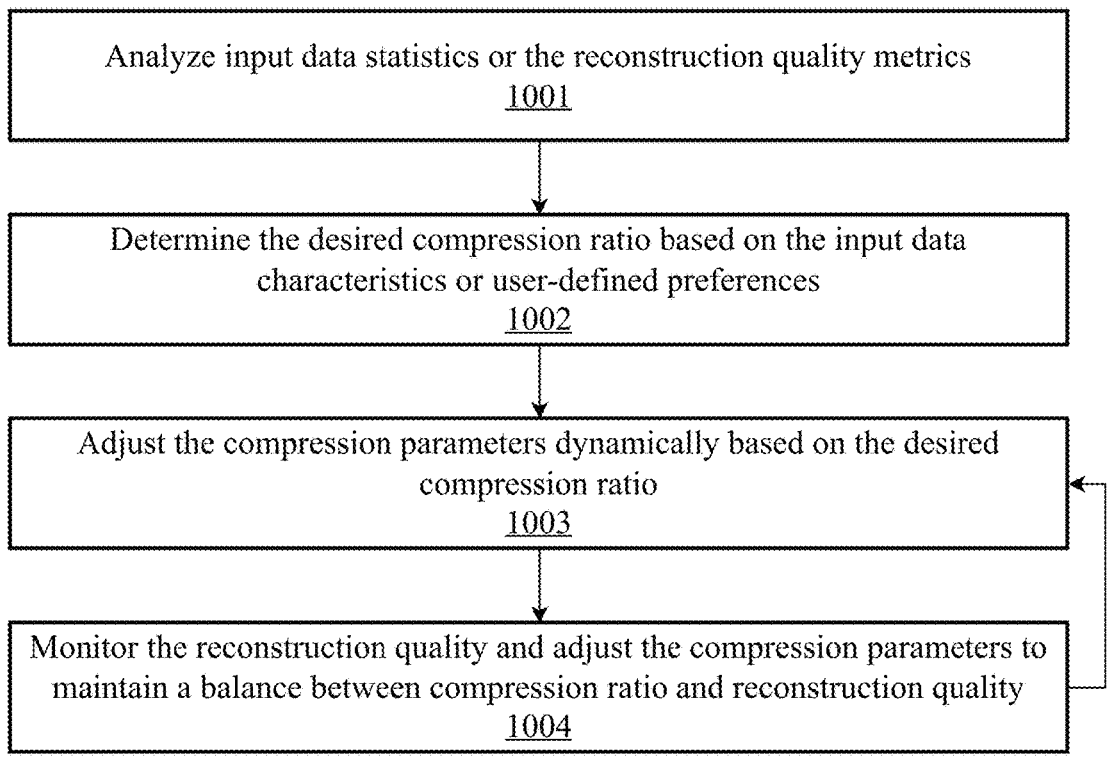
FIG. 10 is a flow diagram illustrating an exemplary method for adaptively adjusting the compression parameters based on the input data, according to an embodiment.

FIG. 10 is a flow diagram illustrating an exemplary method 1000 for adaptively adjusting the compression parameters based on the input data, according to an embodiment. According to the embodiment, the process begins at step 1001 by analyzing the input data statistics (e.g., mean, variance, entropy) or the reconstruction quality metrics (e.g., PSNR, SSIM). At step 1002, the system determines the desired compression ratio based on the input data characteristics or user-defined preferences. At step 1003, the system adjusts the compression parameters (e.g., codebook size, quantization levels) dynamically based on the desired compression ratio. At step 1004, the system monitors the reconstruction quality and adjust the compression parameters to maintain a balance between compression ratio and reconstruction quality.

Consider, for example, a video compression system. The system analyzes the frame-level statistics and determines that scenes with low motion can be compressed more aggressively than scenes with high motion. It dynamically adjusts the codebook size for each frame based on the motion level. For low-motion scenes, it can use a smaller codebook size (e.g., 128) to achieve higher compression, while for high-motion scenes, it uses a larger codebook size (e.g., 512) to preserve more details. The system may monitor the PSNR of the reconstructed frames and adjust the codebook sizes to maintain a target PSNR level.

Figure 11:
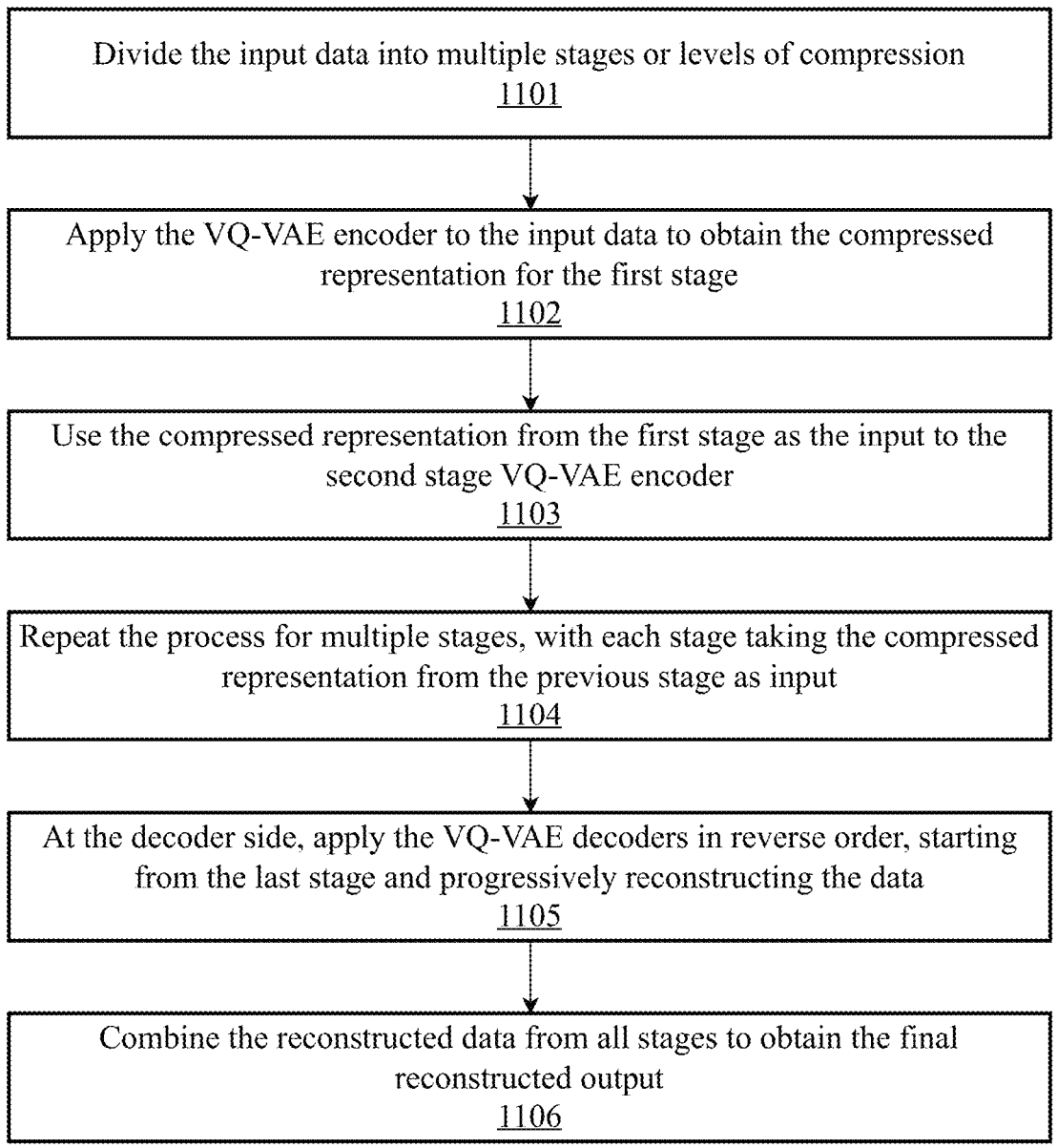
FIG. 11 is a flow diagram illustrating an exemplary method for performing multi-stage compression, according to an embodiment.

FIG. 11 is a flow diagram illustrating an exemplary method 1100 for performing multi-stage compression, according to an embodiment. According to an embodiment, the process begins at step 1101 when the system divides the input data into multiple stages or levels of compression. At step 1102, the system applies the VQ-VAE encoder to the input data to obtain the compressed representation for the first stage. At step 1103, the system uses the compressed representation form the first stage as the input to the second stage VQ-VAE encoder. At step 1104, the process is repeated for multiple stages, with each stage taking the compressed representation from the previous stage as input. At step 1105, at the decoder side, the VQ-VAE decoders are applied in reverse order, starting from the last stage and progressively reconstructing the data. At step 1106, the reconstructed data from all the stages are combined to obtain the final reconstructed output.

Consider, for example, a three-stage compression system for audio data. The raw audio is passed through the first stage VQ-VAE encoder, which compresses it into a low-dimensional representation. The compressed representation from the first stage is then passed through the second stage VQ-VAE encoder, further compressing it. Finally, the compressed representation from the second stage is passed through the third stage VQ-VAE encoder. At the decoder side, the compressed representations are progressively decoded using the corresponding VQ-VAE decoders, and the reconstructed audio from all stages is combined to obtain the final reconstructed audio.

Figure 12:
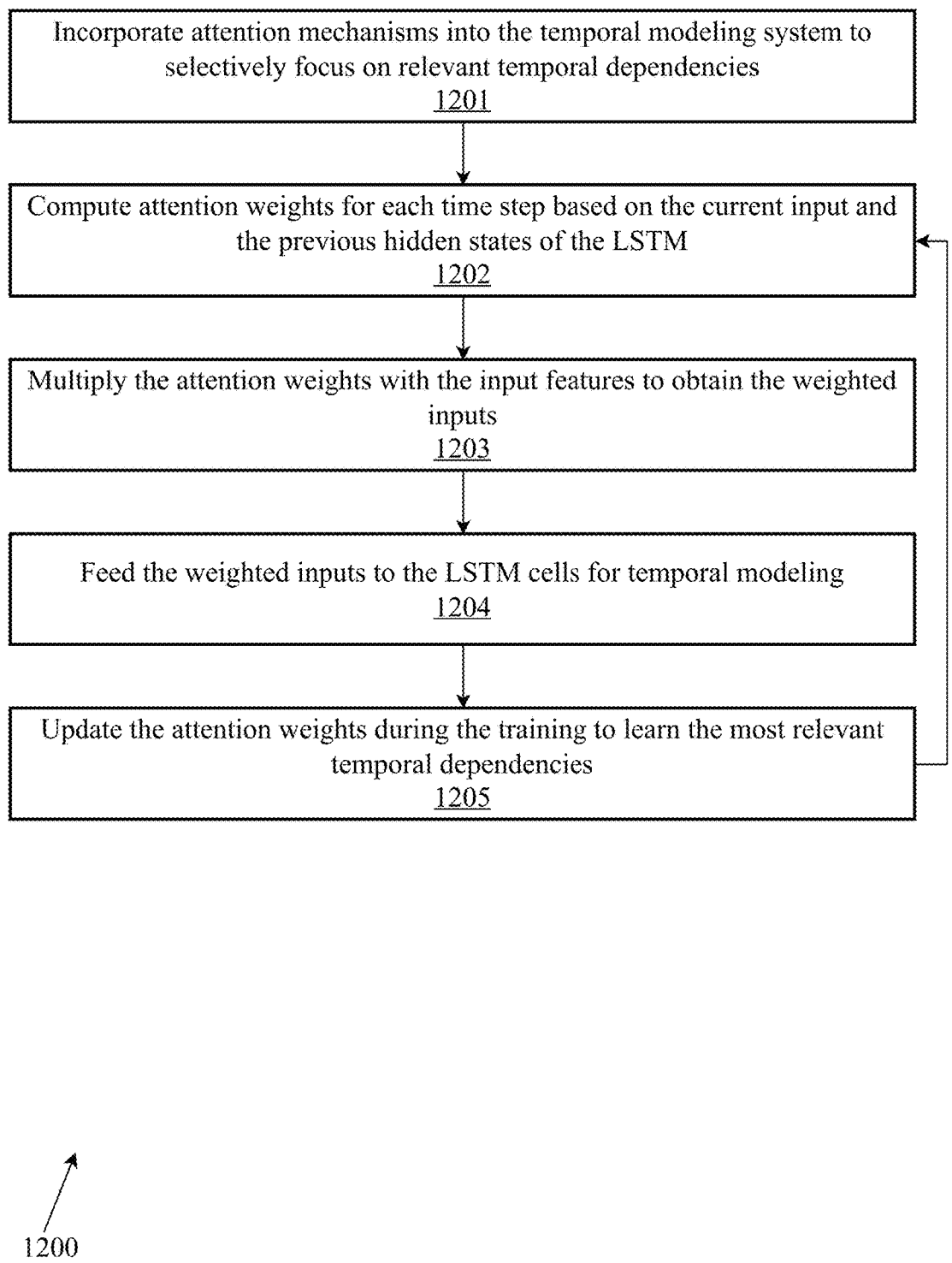
FIG. 12 is a flow diagram illustrating an exemplary method for applying attention mechanisms to the temporal modeling system to selectively focus on relevant temporal dependencies, according to an embodiment

FIG. 12 is a flow diagram illustrating an exemplary method 1200 for applying attention mechanisms to the temporal modeling system to selectively focus on relevant temporal dependencies, according to an embodiment. According to an embodiment, the process begins at step 1201 by incorporating attention mechanisms into the temporal modeling system (e.g., MLP-LSTM) to selectively focus on relevant temporal dependencies. At step 1202, the system computes attention weights for each time step based on the current input and the previous hidden state of the LSTM. At step 1203, the system multiplies the attention weights with the input features to obtain weighted inputs. At step 1204, the system feeds the weighted inputs to the LSTM cells for temporal modeling. At step 1205, the system updates the attention weights during training to learn the most relevant temporal dependencies.

In a video compression system, the system can use an MLP-LSTM with attention for temporal modeling. At each time step, the system computes attention weights based on the current frame features and the previous LSTM hidden state. The attention weights highlight the most relevant frames in the past for predicting the current frame. The system may multiply the attention weights with the frame features to obtain weighted inputs, which are then fed to the LSTM cells. The attention weights are learned during training to capture the most informative temporal dependencies.

Figure 13:
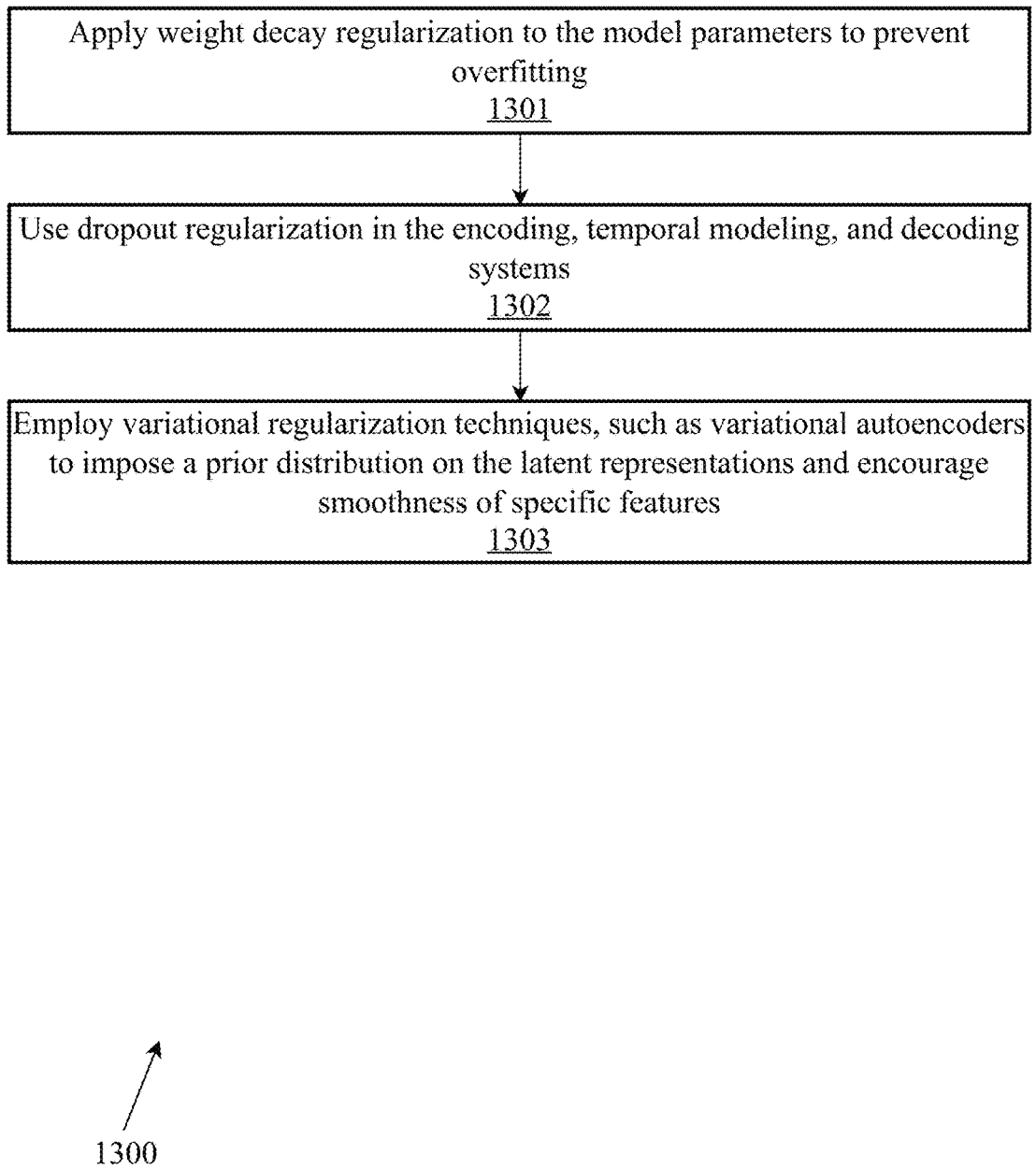
FIG. 13 is a flow diagram illustrating an exemplary method for applying regularization techniques to prevent overfitting and improve generalization, according to an embodiment.

FIG. 13 is a flow diagram illustrating an exemplary method 1300 for applying regularization techniques to prevent overfitting and improve generalization, according to an embodiment. According to an embodiment, the process begins at step 1301 by applying weight decay regularization to the model parameters to prevent overfitting. This may comprise adding a penalty term to the loss function that encourages smaller weight values. At step 1302, the system uses dropout regularization in the encoding, temporal modeling, and decoding systems. This may comprise randomly dropping out a fraction of the units during training to prevent over-reliance on specific features. At step 1303, the system employs variational regularization techniques, such as variational autoencoders, to impose a prior distribution on the latent representations and encourage smoothness and disentanglement.

For example, in an image compression system, the system can apply weight decay regularization to the VQ-VAE encoder and decoder parameters with a decay rate of 0.0001. It can also use dropout regularization with a dropout rate of 0.2 in the MLP-LSTM layers. Additionally, it may incorporate a VAE regularization term in the loss function to encourage the latent representations to follow a Gaussian distribution. These regularization techniques help prevent overfitting and improve the generalization performance of the compression system.

Figure 14:
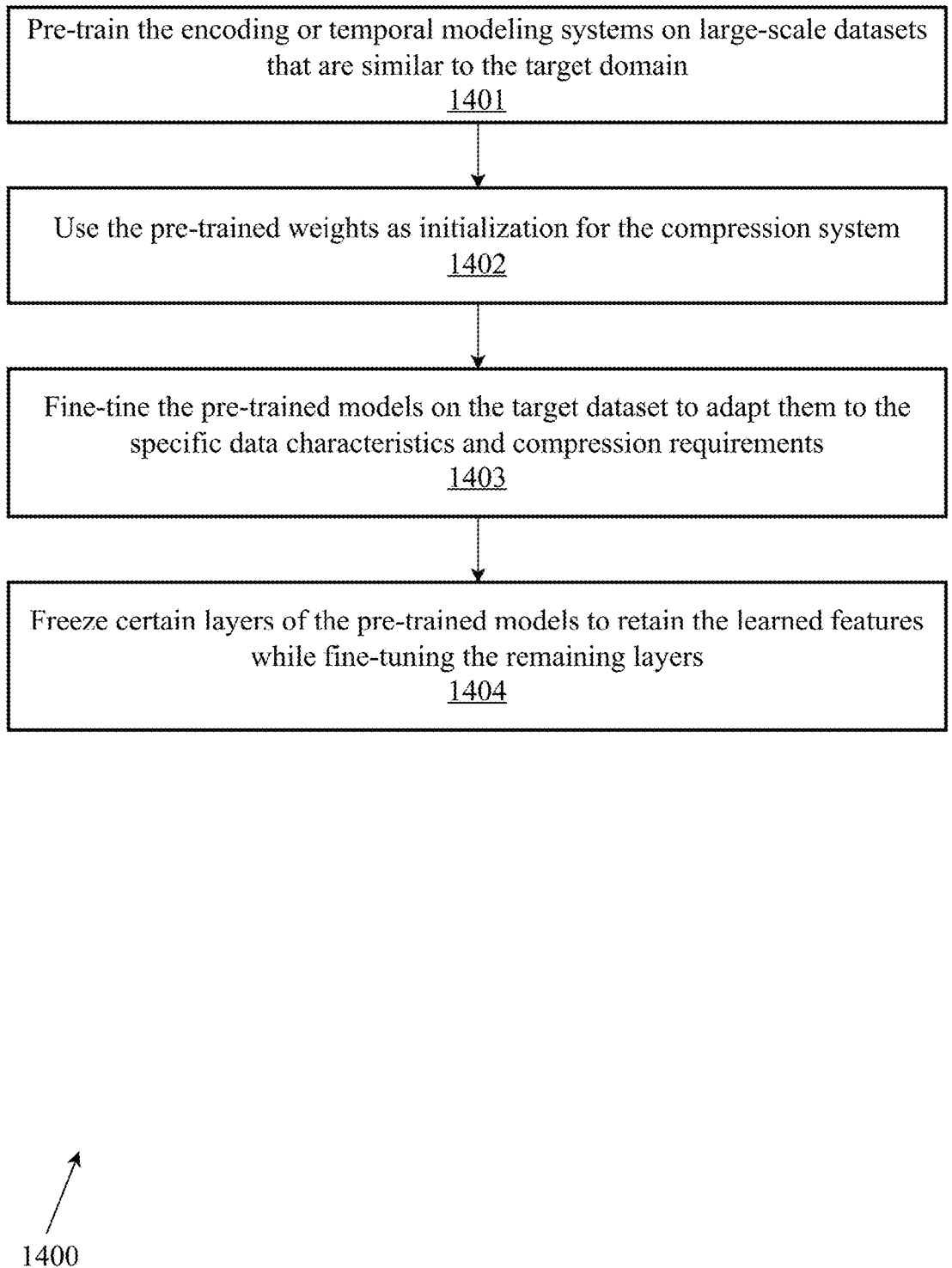
FIG. 14 is a flow diagram illustrating an exemplary method for applying transfer learning to improve the performance of the compression system, according to an embodiment

FIG. 14 is a flow diagram illustrating an exemplary method 1400 for applying transfer learning to improve the performance of the compression system, according to an embodiment. According to an embodiment, the process begins at step 1401 by pre-training the encoding or temporal modeling systems on large-scale datasets that are similar to the target domain. At step 1402, the system uses pre-trained weights as initialization for the compression system. At step 1403, the system fine-tines the pre-trained models on the target dataset to adapt them to the specific data characteristics and compression requirements. At step 1404, the system freezes certain layers of the pre-trained models to retain the learned features while fine-tuning the remaining layers.

For example, consider a video compression system for surveillance videos. The system pre-trains the VQ-VAE encoder on a large dataset of general videos to learn generic video features. It then fine-tunes the pre-trained encoder on a smaller dataset of surveillance videos to adapt it to the specific characteristics of surveillance footage. It can freeze the first few layers of the pre-trained encoder to retain the learned low-level features and fine-tune the remaining layers to capture the high-level semantics of surveillance videos.

Figure 15:
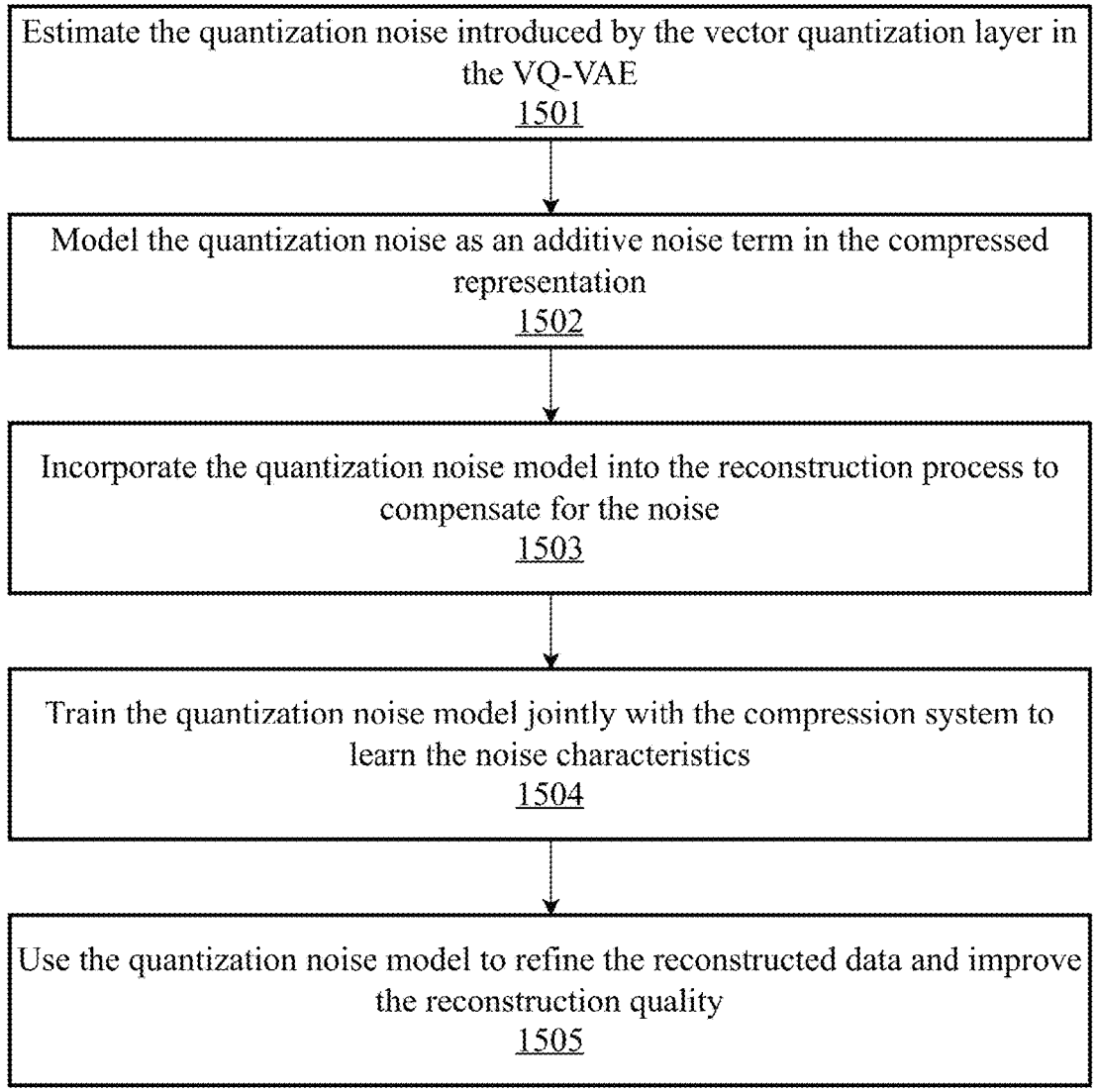
FIG. 15 is a flow diagram illustrating an exemplary method for modeling and compensating for the quantization noise introduced by the vector quantization layer, according to an embodiment.

FIG. 15 is a flow diagram illustrating an exemplary method 1500 for modeling and compensating for the quantization noise introduced by the vector quantization layer, according to an embodiment. According to the embodiment, the process begins at step 1501, by estimating the quantization noise introduced in the vector quantization layer in the VQ-VAE. At step 1502, the quantization noise is modeled as an additive noise term in the compressed representation. At step 1503, the quantization noise model is incorporated into the reconstruction process to compensate for the noise. At step 1504, the quantization noise model may be trained jointly with the compression system to learn the noise characteristics. At step 1505, the system uses the quantization noise model to refine the reconstructed data and improve the reconstruction quality.

In an audio compression system, the system can estimate the quantization noise introduced by the VQ-VAE as a Gaussian noise term. The system can model the noise as an additive term in the compressed representation. During training, the system can jointly learn the compression system and the noise model. At inference time, the system can use the learned noise model to compensate for the quantization noise in the reconstructed audio, resulting in improved audio quality.

Figure 16:
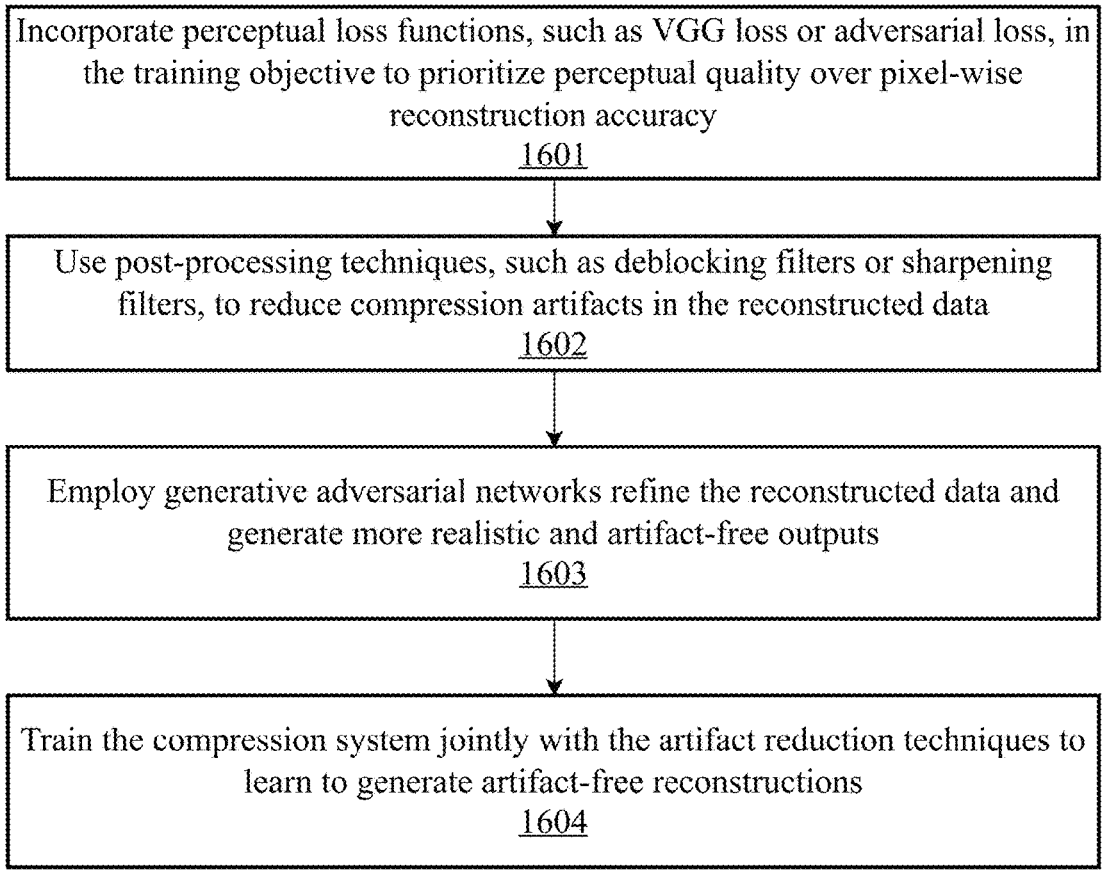
FIG. 16 is a flow diagram illustrating an exemplary method for reducing compression artifacts in the reconstructed data, according to an embodiment.

FIG. 16 is a flow diagram illustrating an exemplary method 1600 for reducing compression artifacts in the reconstructed data, according to an embodiment. According to an embodiment, the process begins at step 1601 by incorporating perceptual loss functions, such as Visual Geometry Group (VGG) loss or adversarial loss, in the training objective to prioritize perceptual quality over pixel-wise reconstruction accuracy. At step 1602, the system various post-processing techniques, such as deblocking filters or sharpening filters, to reduce the compression artifacts in the reconstructed data. At step 1603, the system can employ generative adversarial networks (GANs) to refine the reconstructed data and generate more realistic and artifact-free outputs. At step 1604, the system trains the compression system jointly with the artifact reduction techniques to learn to generate artifact-free reconstructions.

For example, in a video compression system, the system may incorporate a VGG loss term in the training objective to encourage the reconstructed frames to have similar perceptual features as the original frames. It may also use a post-processing deblocking filter to reduce blocking artifacts in the reconstructed frames. Additionally, the system can implement a GAN-based refinement network that takes the reconstructed frames as input and generates more realistic and artifact-free frames. The compression system is trained jointly with the GAN to learn to generate high-quality reconstructions.

Exemplary Computing Environment

Figure 17:
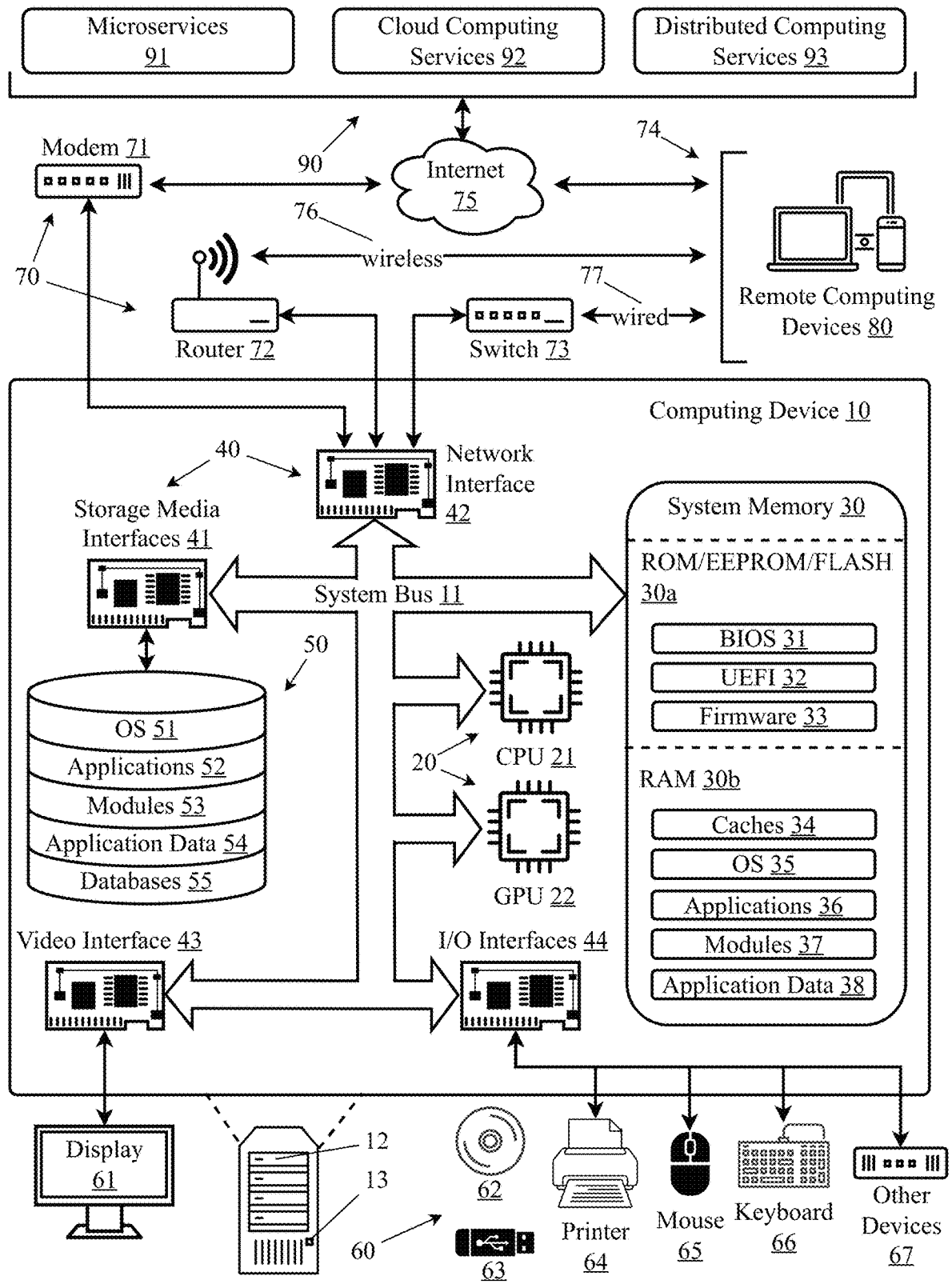
FIG. 17 illustrates an exemplary computing environment on which an embodiment described herein may be implemented, in full or in part.

FIG. 17 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions based on technologies like complex instruction set computer (CISC) or reduced instruction set computer (RISC). Further, computing device 10 may comprise one or more specialized processors such as a graphics processing unit (GPU) 22 configured to accelerate processing of computer graphics and images via a large array of specialized processing cores arranged in parallel. Further computing device 10 may be comprised of one or more specialized processes such as Intelligent Processing Units, field-programmable gate arrays or application-specific integrated circuits for specific tasks or types of tasks. The term processor may further include: neural processing units (NPUs) or neural computing units optimized for machine learning and artificial intelligence workloads using specialized architectures and data paths; tensor processing units (TPUs) designed to efficiently perform matrix multiplication and convolution operations used heavily in neural networks and deep learning applications; application-specific integrated circuits (ASICs) implementing custom logic for domain-specific tasks; application-specific instruction set processors (ASIPs) with instruction sets tailored for particular applications; field-programmable gate arrays (FPGAs) providing reconfigurable logic fabric that can be customized for specific processing tasks; processors operating on emerging computing paradigms such as quantum computing, optical computing, mechanical computing (e.g., using nanotechnology entities to transfer data), and so forth. Depending on configuration, computing device 10 may comprise one or more of any of the above types of processors in order to efficiently handle a variety of general purpose and specialized computing tasks. The specific processor configuration may be selected based on performance, power, cost, or other design constraints relevant to the intended application of computing device 10.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

There are several types of computer memory, each with its own characteristics and use cases. System memory 30 may be configured in one or more of the several types described herein, including high bandwidth memory (HBM) and advanced packaging technologies like chip-on-wafer-on-substrate (CoWoS). Static random access memory (SRAM) provides fast, low-latency memory used for cache memory in processors, but is more expensive and consumes more power compared to dynamic random access memory (DRAM). SRAM retains data as long as power is supplied. DRAM is the main memory in most computer systems and is slower than SRAM but cheaper and more dense. DRAM requires periodic refresh to retain data. NAND flash is a type of non-volatile memory used for storage in solid state drives (SSDs) and mobile devices and provides high density and lower cost per bit compared to DRAM with the trade-off of slower write speeds and limited write endurance. HBM is an emerging memory technology that provides high bandwidth and low power consumption which stacks multiple DRAM dies vertically, connected by through-silicon vias (TSVs). HBM offers much higher bandwidth (up to 1 TB/s) compared to traditional DRAM and may be used in high-performance graphics cards, AI accelerators, and edge computing devices. Advanced packaging and CoWoS are technologies that enable the integration of multiple chips or dies into a single package. CoWoS is a 2.5D packaging technology that interconnects multiple dies side-by-side on a silicon interposer and allows for higher bandwidth, lower latency, and reduced power consumption compared to traditional PCB-based packaging. This technology enables the integration of heterogeneous dies (e.g., CPU, GPU, HBM) in a single package and may be used in high-performance computing, AI accelerators, and edge computing devices.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. In some high-performance computing systems, multiple GPUs may be connected using NVLink bridges, which provide high-bandwidth, low-latency interconnects between GPUs. NVLink bridges enable faster data transfer between GPUs, allowing for more efficient parallel processing and improved performance in applications such as machine learning, scientific simulations, and graphics rendering. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44. Network interface 42 may support various communication standards and protocols, such as Ethernet and Small Form-Factor Pluggable (SFP). Ethernet is a widely used wired networking technology that enables local area network (LAN) communication. Ethernet interfaces typically use RJ45 connectors and support data rates ranging from 10 Mbps to 100 Gbps, with common speeds being 100 Mbps, 1 Gbps, 10 Gbps, 25 Gbps, 40 Gbps, and 100 Gbps. Ethernet is known for its reliability, low latency, and cost-effectiveness, making it a popular choice for home, office, and data center networks. SFP is a compact, hot-pluggable transceiver used for both telecommunication and data communications applications. SFP interfaces provide a modular and flexible solution for connecting network devices, such as switches and routers, to fiber optic or copper networking cables. SFP transceivers support various data rates, ranging from 100 Mbps to 100 Gbps, and can be easily replaced or upgraded without the need to replace the entire network interface card. This modularity allows for network scalability and adaptability to different network requirements and fiber types, such as single-mode or multi-mode fiber.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may be implemented using various technologies, including hard disk drives (HDDs) and solid-state drives (SSDs). HDDs use spinning magnetic platters and read/write heads to store and retrieve data, while SSDs use NAND flash memory. SSDs offer faster read/write speeds, lower latency, and better durability due to the lack of moving parts, while HDDs typically provide higher storage capacities and lower cost per gigabyte. NAND flash memory comes in different types, such as Single-Level Cell (SLC), Multi-Level Cell (MLC), Triple-Level Cell (TLC), and Quad-Level Cell (QLC), each with trade-offs between performance, endurance, and cost. Storage devices connect to the computing device 10 through various interfaces, such as SATA, NVMe, and PCIe. SATA is the traditional interface for HDDs and SATA SSDs, while NVMe (Non-Volatile Memory Express) is a newer, high-performance protocol designed for SSDs connected via PCIe. PCIe SSDs offer the highest performance due to the direct connection to the PCIe bus, bypassing the limitations of the SATA interface. Other storage form factors include M.2 SSDs, which are compact storage devices that connect directly to the motherboard using the M.2 slot, supporting both SATA and NVMe interfaces. Additionally, technologies like Intel Optane memory combine 3D XPoint technology with NAND flash to provide high-performance storage and caching solutions. Non-volatile data storage devices 50 may be non-removable from computing device 10, as in the case of internal hard drives, removable from computing device 10, as in the case of external USB hard drives, or a combination thereof. However, computing devices will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, NoSQL databases, vector databases, knowledge graph databases, key-value databases, document oriented data stores, and graph databases.

Applications (also known as computer software or software applications) are sets of programming instructions designed to perform specific tasks or provide specific functionality on a computer or other computing devices. Applications are typically written in high-level programming languages such as C, C++, Scala, Erlang, GoLang, Java, Scala, Rust, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems facilitated by specifications such as containerd.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network or optical transmitters (e.g., lasers). Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers or networking functions may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices or intermediate networking equipment (e.g., for deep packet inspection).

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90. Also, certain processing subtasks may be sent to a microservice 91 for processing with the result being transmitted to computing device 10 for incorporation into a larger processing task. Infrastructure as Code (IaaC) tools like Terraform can be used to manage and provision computing resources across multiple cloud providers or hyperscalers. This allows for workload balancing based on factors such as cost, performance, and availability. For example, Terraform can be used to automatically provision and scale resources on AWS spot instances during periods of high demand, such as for surge rendering tasks, to take advantage of lower costs while maintaining the required performance levels. In the context of rendering, tools like Blender can be used for object rendering of specific elements, such as a car, bike, or house. These elements can be approximated and roughed in using techniques like bounding box approximation or low-poly modeling to reduce the computational resources required for initial rendering passes. The rendered elements can then be integrated into the larger scene or environment as needed, with the option to replace the approximated elements with higher-fidelity models as the rendering process progresses.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is containerd, which is widely used in software development and deployment. Containerization, particularly with open-source technologies like containerd and container orchestration systems like Kubernetes, is a common approach for deploying and managing applications. Containers are created from images, which are lightweight, standalone, and executable packages that include application code, libraries, dependencies, and runtime. Images are often built from a containerfile or similar, which contains instructions for assembling the image. Containerfiles are configuration files that specify how to build a container image. Systems like Kubernetes natively support containerd as a container runtime. They include commands for installing dependencies, copying files, setting environment variables, and defining runtime configurations. Container images can be stored in repositories, which can be public or private. Organizations often set up private registries for security and version control using tools such as Harbor, JFrog Artifactory and Bintray, GitLab Container Registry, or other container registries. Containers can communicate with each other and the external world through networking. Containerd provides a default network namespace, but can be used with custom network plugins. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, mainframe computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are serverless logic apps, microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, protobuffers, gRPC or message queues such as Kafka. Microservices 91 can be combined to perform more complex or distributed processing tasks. In an embodiment, Kubernetes clusters with containerized resources are used for operational packaging of system.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over public or private networks or the Internet on a subscription or alternative licensing basis, or consumption or ad-hoc marketplace basis, or combination thereof.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power or support for highly dynamic compute, transport or storage resource variance or uncertainty over time requiring scaling up and down of constituent system resources. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, NVLink or other GPU-to-GPU high bandwidth communications links and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A system for controllable lossy compression, comprising:
    a computing device comprising at least a memory and a processor;
    a plurality of programming instructions stored in the memory and operable on the processor, wherein the first plurality of programming instructions, when operating on the processor, cause the computing device to:
        encode input data into a compressed representation using an encoding system;
        introduce a controllable degree of lossy compression to the compressed representation based on one or more compression parameters;
        model temporal dependencies in the compressed representation using a temporal modeling system;
        reconstruct the input data from the compressed representation using a decoding system; and
        jointly optimize the encoding system, the temporal modeling system, and the decoding system to minimize a joint loss function.

2. The system of claim 1, wherein the encoding system comprises a Vector Quantized Variational Autoencoder (VQ-VAE) encoder.

3. The system of claim 2, wherein the one or more compression parameters include a size of a learned codebook used by the VQ-VAE encoder for quantization.

4. The system of claim 1, wherein the temporal modeling system comprises a Multilayer Perceptron Long Short-Term Memory system.

5. The system of claim 1, wherein the decoding system comprises a Vector Quantized Variational Autoencoder decoder.

6. The system of claim 1, wherein the joint loss function comprises a combination of reconstruction loss, quantization loss, and temporal modeling loss.

7. The system of claim 1, wherein the input data comprises one or more of image data, video data, audio data, and time-series data.

8. The system of claim 1, wherein the computing device is further caused to preprocess the input data using a data preprocessing system prior to encoding the input data.

9. The system of claim 1, wherein the computing device is further caused to post-process the reconstructed input data using a data post-processing system.

10. The system of claim 1, wherein the one or more compression parameters are adjustable based on a desired trade-off between compression ratio and reconstruction quality.

11. A method for controllable lossy compression, comprising the steps of:
    encoding input data into a compressed representation using an encoding system;
    introducing a controllable degree of lossy compression to the compressed representation based on one or more compression parameters;
    modeling temporal dependencies in the compressed representation using a temporal modeling system;
    reconstructing the input data from the compressed representation using a decoding system; and
    jointly optimizing the encoding system, the temporal modeling system, and the decoding system to minimize a joint loss function.

12. The method of claim 11, wherein the encoding system comprises a Vector Quantized Variational Autoencoder (VQ-VAE) encoder.

13. The method of claim 12, wherein the one or more compression parameters include a size of a learned codebook used by the VQ-VAE encoder for quantization.

14. The method of claim 11, wherein the temporal modeling system comprises a Multilayer Perceptron Long Short-Term Memory system.

15. The method of claim 11, wherein the decoding system comprises a Vector Quantized Variational Autoencoder decoder.

16. The method of claim 11, wherein the joint loss function comprises a combination of reconstruction loss, quantization loss, and temporal modeling loss.

17. The method of claim 11, wherein the input data comprises one or more of image data, video data, audio data, and time-series data.

18. The method of claim 11, further comprising the step of preprocessing the input data using a data preprocessing system prior to encoding the input data.

19. The method of claim 11, further comprising the step of post-processing the reconstructed input data using a data post-processing system.

20. The method of claim 11, wherein the one or more compression parameters are adjustable based on a desired trade-off between compression ratio and reconstruction quality.

21. Non-transitory, computer-readable storage media having computer-executable instructions embodied thereon that, when executed by one or more processors of a computing system employing a controllable lossy compression system, cause the computing system to:

encode input data into a compressed representation using an encoding system;

introduce a controllable degree of lossy compression to the compressed representation based on one or more compression parameters;

model temporal dependencies in the compressed representation using a temporal modeling system;

reconstruct the input data from the compressed representation using a decoding system; and jointly optimize the encoding system, the temporal modeling system, and the decoding system to minimize a joint loss function.

22. The non-transitory, computer-readable storage media of claim 21, wherein the encoding system comprises a Vector Quantized Variational Autoencoder (VQ-VAE) encoder.

23. The non-transitory, computer-readable storage media of claim 22, wherein the one or more compression parameters include a size of a learned codebook used by the VQ-VAE encoder for quantization.

24. The non-transitory, computer-readable storage media of claim 21, wherein the temporal modeling system comprises a Multilayer Perceptron Long Short-Term Memory system.

25. The non-transitory, computer-readable storage media of claim 21, wherein the decoding system comprises a Vector Quantized Variational Autoencoder decoder.

26. The non-transitory, computer-readable storage media of claim 21, wherein the joint loss function comprises a combination of reconstruction loss, quantization loss, and temporal modeling loss.

27. The non-transitory, computer-readable storage media of claim 21, wherein the input data comprises one or more of image data, video data, audio data, and time-series data.

28. The non-transitory, computer-readable storage media of claim 21, wherein the computing system is further caused to preprocess the input data using a data preprocessing system prior to encoding the input data.

29. The non-transitory, computer-readable storage media of claim 21, wherein the computing system is further caused to post-process the reconstructed input data using a data post-processing system.

30. The non-transitory, computer-readable storage media of claim 21, wherein the one or more compression parameters are adjustable based on a desired trade-off between compression ratio and reconstruction quality.

* * * * *